(12) United States Patent
Notsu et al.

(10) Patent No.: US 7,750,367 B2
(45) Date of Patent: *Jul. 6, 2010

(54) SEMICONDUCTOR MEMBER, MANUFACTURING METHOD THEREOF, AND SEMICONDUCTOR DEVICE

(75) Inventors: Kazuya Notsu, Chigasaki (JP); Kiyofumi Sakaguchi, Yokohama (JP); Nobuhiko Sato, Sagamihara (JP); Hajime Ikeda, Chigasaki (JP); Shoji Nishida, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 433 days.

This patent is subject to a terminal disclaimer.

(21) Appl. No.: 11/711,711

(22) Filed: Feb. 28, 2007

(65) Prior Publication Data

US 2007/0272944 A1 Nov. 29, 2007

Related U.S. Application Data

(62) Division of application No. 10/540,261, filed on Jun. 23, 2005, now Pat. No. 7,238,973.

(30) Foreign Application Priority Data

Sep. 13, 2004 (JP) .............................. 2004-265559

(51) Int. Cl.
*H01L 29/165* (2006.01)
*H01L 29/786* (2006.01)

(52) U.S. Cl. ................ 257/190; 257/183; 257/E29.085

(58) Field of Classification Search .................. 257/183, 257/190

See application file for complete search history.

(56) References Cited

U.S. PATENT DOCUMENTS

| 5,221,413 | A | | 6/1993 | Brasen et al. .................. 117/89 |
| 5,458,755 | A | | 10/1995 | Fujiyama et al. ............ 204/224 |
| 5,757,024 | A | * | 5/1998 | Fathauer et al. ................ 257/19 |
| 6,180,497 | B1 | | 1/2001 | Sato et al. .................... 438/458 |

(Continued)

FOREIGN PATENT DOCUMENTS

EP    1 248 294 A2    10/2002

(Continued)

OTHER PUBLICATIONS

Taiwanese Office Action in counterpart Application No. 93140621and translation thereof.

(Continued)

*Primary Examiner*—Jerome Jackson, Jr.
(74) *Attorney, Agent, or Firm*—Fitzpatrick, Cella, Harper & Scinto

(57) ABSTRACT

An SiGe layer is grown on a silicon substrate. The SiGe layer or the silicon substrate and SiGe layer are porosified by anodizing the SiGe layer to form a strain inducing porous layer or a porous silicon layer and strain inducing porous layer. An SiGe layer and strained silicon layer are formed on the resultant structure. The SiGe layer in the stacking growth step only needs to be on the uppermost surface of the porous layer. For this reason, an SiGe layer with a low defect density and high concentration can be formed. Since the SiGe layer on the strain inducing porous layer can achieve a low defect density without lattice mismatching. Hence, a high-quality semiconductor substrate having a high strained silicon layer can be obtained.

3 Claims, 35 Drawing Sheets

U.S. PATENT DOCUMENTS

| | | | |
|---|---|---|---|
| 6,309,945 B1 | 10/2001 | Sato et al. | 438/409 |
| 6,313,014 B1 | 11/2001 | Sakaguchi et al. | 438/475 |
| 6,350,703 B1 | 2/2002 | Sakaguchi et al. | 438/766 |
| 6,448,155 B1 | 9/2002 | Iwasaki et al. | 438/464 |
| 6,468,663 B1 | 10/2002 | Sato et al. | 428/446 |
| 6,468,923 B1 | 10/2002 | Yonehara et al. | 438/761 |
| 6,524,935 B1 | 2/2003 | Canaperi et al. | 438/478 |
| 6,649,492 B2 | 11/2003 | Chu et al. | 438/478 |
| 6,712,288 B2 | 3/2004 | Yanagita et al. | 239/101 |
| 6,720,237 B2 | 4/2004 | Iwasaki et al. | 438/458 |
| 6,828,214 B2 | 12/2004 | Notsu et al. | 438/455 |
| 6,890,835 B1 | 5/2005 | Chu et al. | 438/458 |
| 6,953,948 B2 | 10/2005 | Sakaguchi | 257/48 |
| 7,017,830 B2 | 3/2006 | Yanagita et al. | 239/101 |
| 2003/0119280 A1 | 6/2003 | Lee et al. | 438/459 |
| 2003/0230778 A1 | 12/2003 | Park et al. | 257/349 |
| 2005/0280119 A1 | 12/2005 | Momoi et al. | 257/620 |

FOREIGN PATENT DOCUMENTS

| | | |
|---|---|---|
| JP | 7-302889 | 11/1995 |
| JP | 11-195562 | 7/1999 |
| JP | 2002-299261 | 10/2002 |
| JP | 2003-78118 A | 3/2003 |
| JP | 2003-78140 | 3/2003 |
| JP | 2003-178977 A | 6/2003 |
| JP | 2003-282463 A | 10/2003 |
| JP | 2003-282464 A | 10/2003 |
| JP | 2004-342975 A | 12/2004 |
| TW | 533501 | 5/2003 |

OTHER PUBLICATIONS

Michael I. Current, et al. "Atomic-layer Cleaving with SiGe Strain Layers for Fabrication on Si and Ge-rich SOI Device Layers", IEEE International SOI Conference, Oct. 2001, pp. 11-12.

Shin-ichi Takagi, "Metal-Oxide-Semiconductor (MOS) device technologies using Si/Ge heretointerfaces", Oyo Buturi, vol. 72, No. 3, pp. 284-290, 2003.

T.A. Langdo, et al., Appl. Phys. Lett., vol. 56, No. 4, pp. 4256-4258 (2003).

D.J. Godbey, et al., Appl. Phys. Lett., vol. 56, No. 4, pp. 373-379 (1990).

D. Feijoo, et al., J. Electro. Mat., vol. 23, No. 6, pp. 493-496 (1994).

A.H. Krist, et al., Appl. Phys. Lett., vol. 58, No. 17, pp. 1899-1901 (1991).

* cited by examiner

F I G. 1
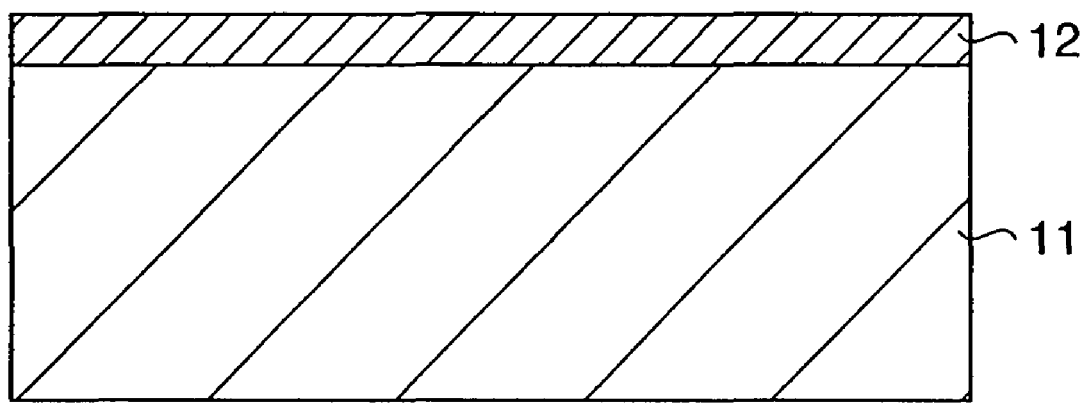

F I G. 12
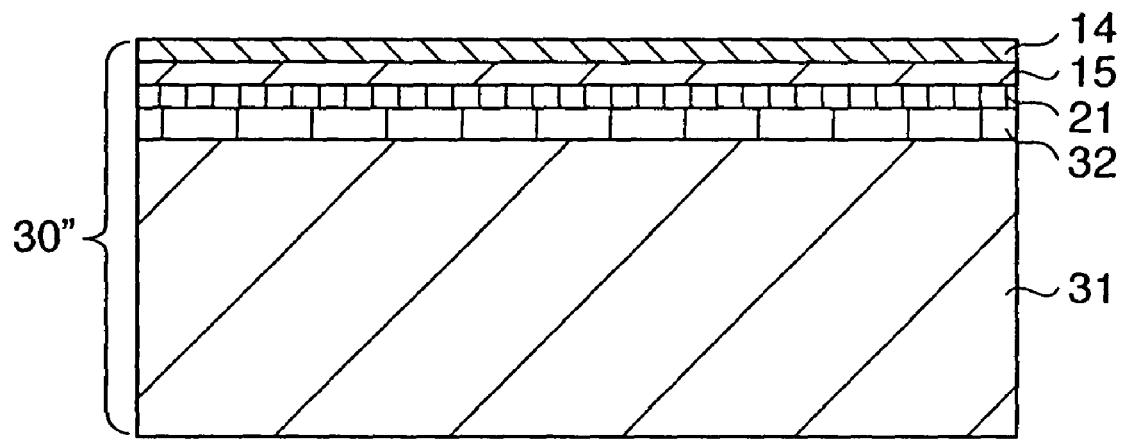

F I G. 15
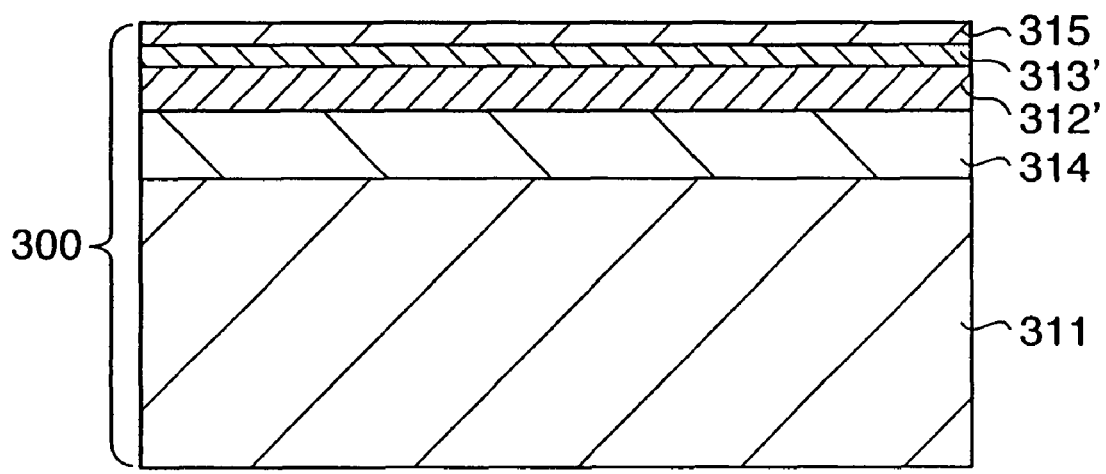

F I G. 19
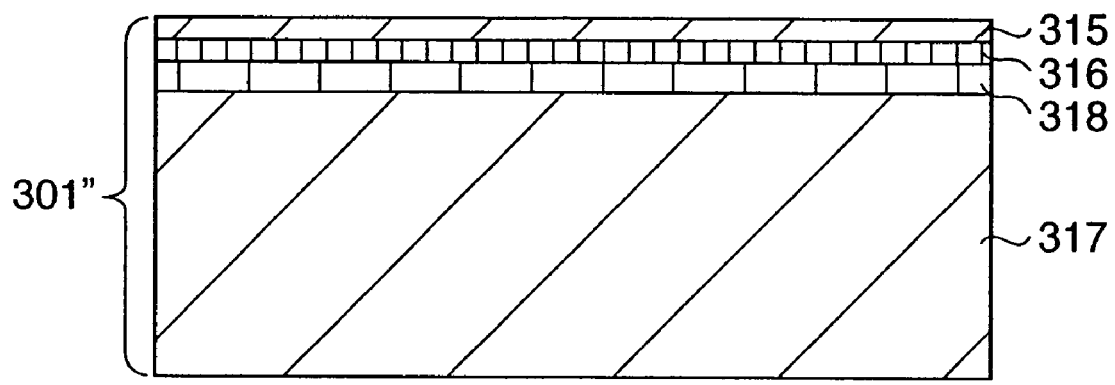

SEMICONDUCTOR MEMBER, MANUFACTURING METHOD THEREOF, AND SEMICONDUCTOR DEVICE

This application is a division of U.S. application Ser. No. 10/540,261, filed on Jun. 23, 2005 now U.S. Pat. No. 7,238,973.

BACKGROUND OF THE INVENTION

Field of the Invention

The present invention relates to a semiconductor member having strained silicon, a manufacturing method of a semiconductor member formed by using strained silicon, and a semiconductor device.

As a substrate to form a semiconductor device to increase the hole mobility, a substrate having a strained silicon layer has received a great deal of attention. A layer (SiGe layer) made of silicon (Si) and germanium (Ge) is grown on a silicon substrate, and a single-crystal silicon layer is grown on that layer. Accordingly, a strain is applied to the silicon layer, and a strained silicon layer is obtained. This strain occurs because the lattice constant of the SiGe layer is slightly larger than that of the single-crystal silicon layer.

Tayanaka has reported a semiconductor substrate which facilitates separation of a thin semiconductor layer by forming a layer containing SiGe, GaAs, GaP, or GaN on a silicon substrate, forming a porous layer by anodizing, and forming a thin semiconductor film on the porous layer, and a manufacturing method of the semiconductor substrate (Japanese Patent Laid-Open No. 11-195562).

As a characteristic feature of the above-described strained silicon manufacturing technique, a relaxed SiGe layer is formed on a substrate. To relax the SiGe layer, crystal defects on the interface to the substrate are used. Since the defects propagate to even the uppermost silicon layer, it is difficult to obtain a high-quality silicon layer. In addition, to relax the SiGe layer, a thick layer of several μm is necessary. Hence, the manufacturing cost is high.

As a characteristic feature of the technique of Tayanaka, a porous layer containing SiGe, GaAs, GaP, or GaN is used as the separation layer of the thin silicon layer. This is different from the viewpoint of the present invention, i.e., using a porous layer as a strain induction layer.

DISCLOSURE OF INVENTION

The present invention has been made in consideration of the above situations, and has as its object to provide a new technique to relax the strain of an SiGe layer by forming a porous layer by anodizing the SiGe layer and obtain a high-quality strained silicon layer.

A semiconductor member according to the present invention is characterized by comprising a porous semiconductor layer which is made of a strain inducing material, and a strained semiconductor layer which is formed on the porous semiconductor layer.

A semiconductor member according to the present invention is characterized by comprising a first porous semiconductor layer which is made of a strain inducing material on a semiconductor substrate, a second porous semiconductor layer which is formed on the first porous semiconductor layer, and a strained semiconductor layer which is formed on the second porous semiconductor layer.

When a semiconductor member obtained by the present invention is used, strained-SOI can be manufactured. Generally, SOI is short for Silicon On Insulator. In this application, SOI is short for Semiconductor On Insulator in a broader sense.

A strained-SOI manufacturing method is characterized by comprising a) a preparation step of preparing a first member, which includes a step of porosifying a semiconductor layer (or a first semiconductor layer containing a strain inducing material and a second semiconductor layer on the first semiconductor layer) containing a strain inducing material (a semiconductor material and an additional material) by anodizing, substantially forming a layer (strained semiconductor layer) made of a semiconductor such as silicon on the semiconductor layer, and forming an insulating layer on the surface of the strained semiconductor layer, and b) a transfer step of transferring the strained semiconductor layer and insulating layer from the first member to a second member after the first member is bonded to the second member via the insulating layer. The insulating layer only needs to be at least on one of the first member side and the second member side. The insulating layer may be formed on both of the first member and second member.

According to a preferred aspect of the present invention, preferably, the preparation step comprises a stacking step of anodizing the layer containing the strain inducing material and forming the silicon layer on the layer, the manufacturing method comprises an insulating layer formation step of forming the insulating layer on the silicon layer of the first member, and the stacking step, insulating layer formation step, and transfer step are executed in this order.

According to a preferred aspect of the present invention, preferably, the first member has a silicon layer under the porous silicon layer, and in the transfer step, a portion from the strained silicon layer to the insulating layer is transferred from the first member to the second member.

According to a preferred aspect of the present invention, the additional material preferably contains germanium.

According to a preferred aspect of the present invention, the insulating layer is preferably a silicon oxide film.

According to a preferred aspect of the present invention, preferably, the first member has a separation layer in the strain induction porous layer, the interface between the strain induction porous layer and the silicon porous layer, or the interface between the strain induction layer and the silicon substrate, and in the transfer step, the second member is bonded to the first member on which the insulating layer is formed in the insulating layer formation step, and then, the bonded member is separated at the separation layer.

According to a preferred aspect of the present invention, the layer containing the additional material of the first member and the strained silicon layer are preferably formed by CVD.

According to a preferred aspect of the present invention, the layer containing the additional material of the first member may continuously be formed in a CVD step while changing one of a flow rate and a concentration of a source gas to supply the additional material gradually or stepwise.

According to a preferred aspect of the present invention, preferably, the first member has a silicon porous layer, strain inducing porous layer, and strained silicon layer on the silicon substrate, and has a separation layer in the strain inducing porous layer, the interface between the strain inducing porous layer and the silicon porous layer, or the interface between the strain inducing layer and the silicon substrate.

According to the present invention, by forming a strain inducing porous semiconductor layer with few crystal defects and forming a single-crystal semiconductor layer on the strain inducing porous semiconductor layer, a member having a strained semiconductor layer with a low defect density can be provided.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 1 is a view showing an additional material stacking step according to the first and second embodiments;

FIG. 12 is a view showing a removal step according to the modification to the second embodiment;

FIG. 15 is a view showing a stacking step according to the third and fourth embodiments;

FIG. 19 is a view showing a removal step according to the fourth embodiment;

BEST MODE FOR CARRYING OUT THE INVENTION

Figure 2:
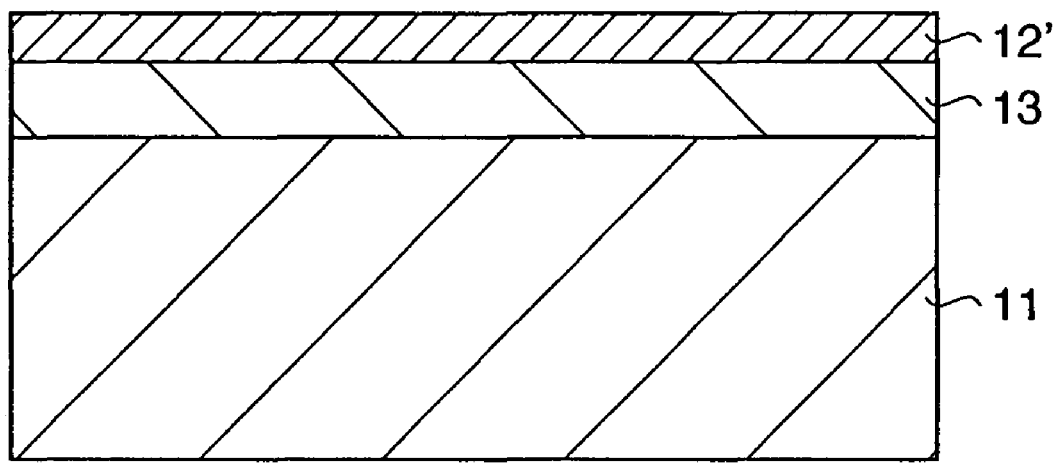
FIG. 2 is a view showing an anodizing step according to the first and second embodiments.

According to the preferred embodiments of the present invention, a semiconductor layer containing a strain inducing material is formed on the surface of a first member, a porous layer is formed by anodizing the surface side of the semiconductor layer containing the strain inducing material, and a layer (preferably, a single-crystal silicon layer) essentially made of silicon is formed on the porous layer.

According to this method, when a semiconductor layer containing the strain induction material is present at least on the uppermost surface of the porous layer, a strained silicon layer can be formed. Since the semiconductor layer containing the strain induction material can be thin, the quality can be increased, and the concentration can also be increased.

Preferred embodiments of the present invention will be described below.

First Embodiment

A method of manufacturing a semiconductor substrate (member) according to the first embodiment of the present invention will be described with reference to FIGS. 1 to 3B.

In the step (stacking step) shown in FIG. 1, a layer 12 containing silicon and germanium (additional material) is epitaxially grown on a silicon substrate 11.

First, the layer 12 (SiGe layer: for example, Ge=30%) containing silicon and germanium (additional material) is epitaxially grown on the single-crystal silicon substrate 11 by CVD by lamp heating. The conditions are preferably as follows.

Carrier Gas: $H_2$

The flow rate of $H_2$ is preferably 25 to 45 l/min and, typically, 30 l/min.

First Source Gas: $SiH_4$

The flow rate of $SiH_4$ is preferably 50 to 300 sccm and, typically, 100 sccm.

Second Source Gas: 2% $GeH_4$

The flow rate of 2% $GeH_4$ is preferably 20 to 500 sccm and, typically, 300 sccm.

Chamber Pressure

The chamber pressure is preferably 10 to 100 Torr and, typically, 100 Torr.

Temperature

The temperature is preferably 650° C. to 680° C.

Growth Rate

The growth rate is preferably 10 to 50 nm/min.

The layer 12 is preferably continuously formed by changing the flow rate or concentration of the $GeH_4$ gas gradually or stepwise. More specifically, the composition ratio of Ge is changed depending on the mixture ratio of the source gases. Preferably, the Ge concentration is set low at the early stage of growth on the single-crystal silicon substrate 11 and increased as the epitaxial growth progresses. The Ge ratio is preferably finally set to x=0.1 to 0.5.

Next, the SiGe layer 12 formed by epitaxial growth is anodized, as shown in FIG. 2. Anodizing can typically be done by filling an anodizing tank having a platinum electrode pair with a solution containing hydrogen fluoride (HF), placing the silicon substrate 11 including the SiGe epitaxial growth layer 12 between the electrodes, and supplying a current between the electrodes. A porous SiGe layer 12' and porous silicon layer 13 formed by this step have a fragile structure and function as a separation layer in the separation step later. Conditions for anodizing of the SiGe layer 12 are basically determined on the basis of Si porosification conditions disclosed in, e.g., Japanese Patent Laid-Open No. 7-302889 and appropriately set in accordance with the Ge concentration.

The silicon substrate 11 need not always be porosified. The porous silicon layer 13 need not always be formed. Porosification need not always be executed for the entire SiGe layer 12. Porosification may be executed in only the surface region of the SiGe layer 12.

Figure 4:
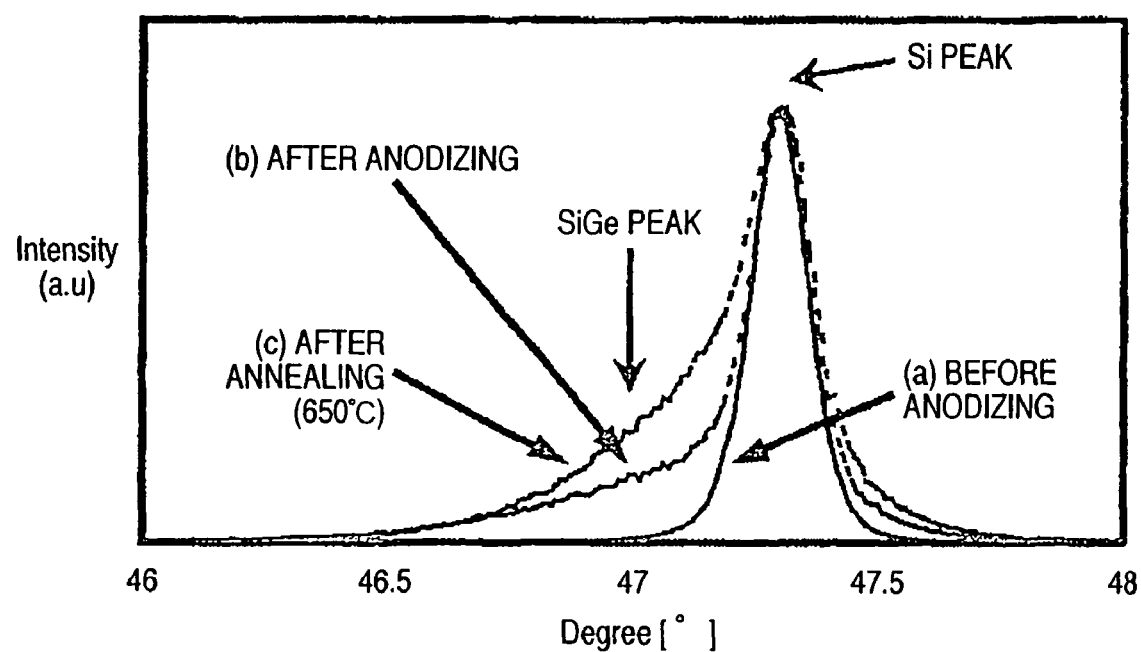
FIG. 4 is an XRD chart showing lattice relaxation of a porous SiGe layer.

Lattice relaxation can be caused in the SiGe layer 12 by porosifying it by anodizing. Referring to FIG. 4, (a) indicates an XRD chart before anodizing, and (b) indicates an XRD chart after anodizing. As is apparent from (a) and (b) in FIG. 4, the SiGe peak intensity increases, and lattice relaxation of the SiGe layer progresses upon porosification.

A protective film such as an oxide film may be formed on the surfaces of internal pores of the porous layer. Alternatively, a plurality of layers having different porosities may be formed by controlling the anodizing solution or current. For example, a first porous layer may be formed on the side of the single-crystal silicon substrate 11, and a second porous layer having a lower porosity than the first porous layer may be formed under the first porous layer. When the difference in porous structure between the SiGe layer and the silicon layer is used, the interface between the porous SiGe layer 12' and the porous silicon layer 13 can be used as the separation layer by anodizing under the same conditions.

It is also preferable to execute annealing in, e.g., a hydrogen atmosphere after porosification of the SiGe layer 12.

The intrinsic lattice strain in the SiGe layer 12 is relaxed by porosification ((b) in FIG. 4). When annealing is performed, the lattice strain is further relaxed ((c) in FIG. 4) so that the strain can more effectively propagate to a single-crystal silicon layer to be formed later. FIG. 4 is a chart by XRD measurement. The chart after annealing indicates that the SiGe peak intensity is high, and lattice relaxation of the porous layer further progresses.

The annealing conditions to promote relaxation in the strain induction porous layer are as follows.

Carrier Gas: $H_2$

The flow rate of $H_2$ is preferably 15 to 45 l/min and, typically, 30 l/min.

Chamber Pressure

The chamber pressure is preferably 10 to 600 Torr and, typically, 30 Torr.

Annealing Temperature

The annealing temperature is preferably 650° C. to 1,000° C. and, typically, 650° C.

Next, a single-crystal SiGe layer 14 is epitaxially grown on the strain induction SiGe layer 12' by CVD.

The conditions are preferably as follows.

Carrier Gas: $H_2$

The flow rate of $H_2$ is preferably 25 to 45 l/min and, typically, 30 l/min.

First Source Gas: $SiH_4$

The flow rate of $SiH_4$ is preferably 50 to 300 sccm and, typically, 100 sccm.

Second Source Gas: 2% $GeH_4$

The flow rate of 2% $GeH_4$ is preferably 20 to 500 sccm and, typically, 300 sccm.

Chamber Pressure

The chamber pressure is preferably 10 to 100 Torr and, typically, 100 Torr.

Temperature

The temperature is preferably 650° C. to 680° C.

Growth Rate

The growth rate is preferably 10 to 50 nm/min.

The single-crystal SiGe layer 14 may be omitted. However, the single-crystal SiGe layer 14 is preferably formed to stabilize the strained silicon layer because the strain in the strained silicon layer may be relaxed by a change in structure of the porous layer by annealing in the epitaxial growth step or device manufacturing step later. The following steps will be described with reference to FIG. 3A assuming that no single-crystal SiGe layer 14 is formed. When the single-crystal SiGe layer 14 is formed, the sectional structure shown in FIG. 3B is obtained.

A single-crystal silicon layer 15 is epitaxially grown on the strain induction porous layer 12' by CVD.

The growth conditions of the single-crystal silicon layer 15 are as follows.

Carrier Gas: $H_2$

The flow rate of hydrogen is preferably 15 to 45 l/min and, typically, 30 l/min.

Source Gas: $SiH_2Cl_2$

The flow rate of the source gas is preferably 50 to 200 SCCM and, typically, 100 SCCM.

Chamber Pressure

The chamber pressure is preferably 10 to 100 Torr and, typically, 80 Torr.

Growth Temperature

The growth temperature is preferably 650° C. to 1,000° C. and, typically, 900° C.

It is also preferable to anneal (prebake) the surface of the porous layer in a hydrogen atmosphere before growth of the single-crystal silicon layer. In prebaking, the flow rate of hydrogen is preferably 15 to 45 l/min (typically 30 l/min). The temperature is preferably 700° C. to 1,000° C. (typically 950° C.). The chamber pressure is preferably 10 to 760 Torr (typically 600 Torr). At the early stage, the single-crystal silicon layer is preferably grown at a low growth rate of 50 nm/min or less.

Figure 3A:
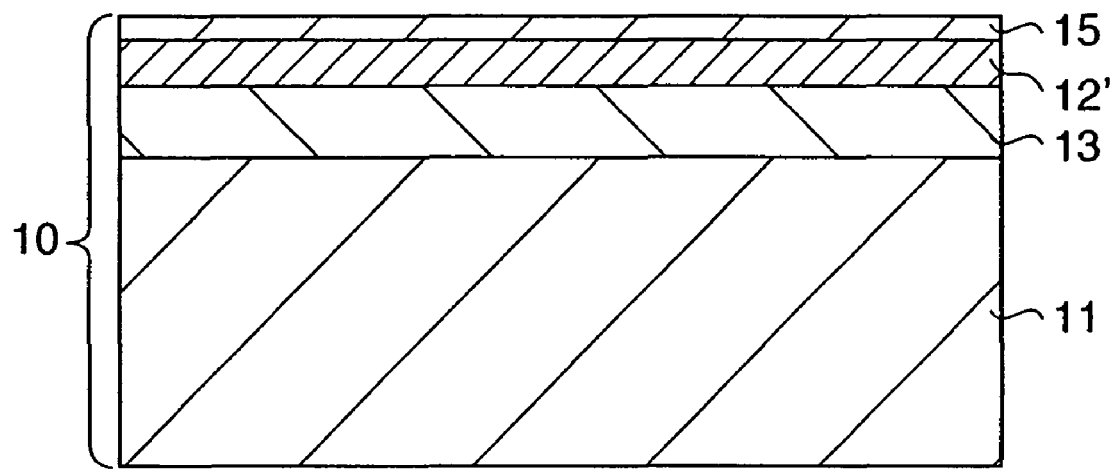
FIGS. 3A and 3B are views showing a stacking step according to the first and second embodiments.
Figure 3B:
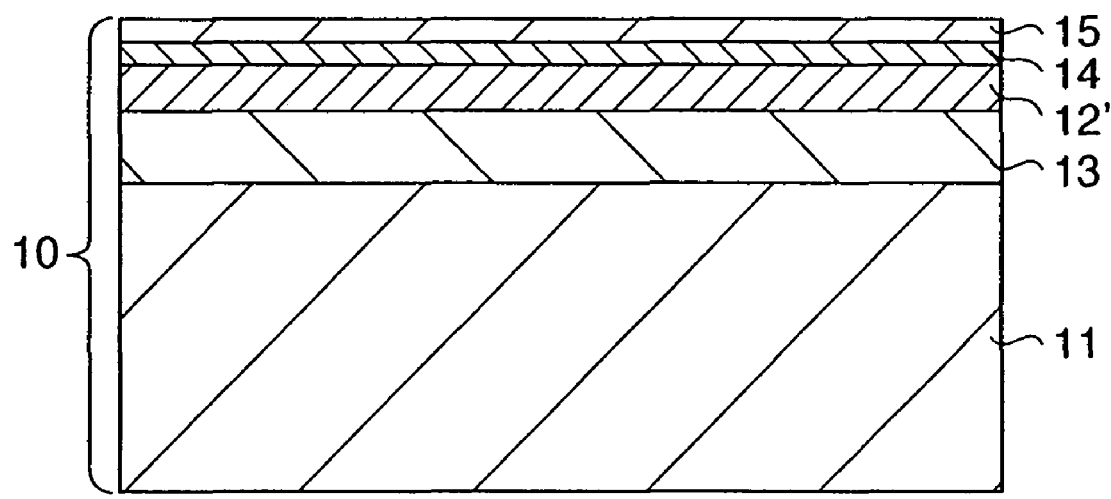

With the above-described step, a first substrate (member) 10 schematically shown in FIG. 3A or 3B is obtained.

Second Embodiment

When a semiconductor member having a strained silicon layer obtained by the above-described method is used, strained-SOI having the strained silicon layer on an insulating layer by a transfer method can be manufactured. As already described above, in this application, SOI is short for Semiconductor On Insulator. This embodiment will be described by using silicon as an example of the semiconductor. In the transfer method, a first member having a transfer target layer (including at least two layers) on a separation layer with a fragile structure is bonded to a second member while sandwiching the transfer target layer. After that, the bonded composite member (bonded member) is separated at the separation layer.

According to this method, the transfer target layer is transferred from the first member to the second member such that the lower layer of the transfer target layer formed on the first member becomes the upper layer of the second member, and the upper layer of the transfer target layer formed on the first member becomes the lower layer of the second member. That is, according to this method, the layers sequentially formed on the first member are formed sequentially in a reverse order on the second member.

According to the preferred embodiment of the semiconductor device, a layer containing an additional material is formed on a silicon substrate by epitaxial growth. A porous layer is formed by anodizing. A layer (preferably, a single-crystal silicon layer) almost made of silicon is formed on the porous layer. An insulating layer is further formed on the layer by thermal oxidation. Next, the second member is bonded to the first member such that the insulating layer is sandwiched between them. Then, the bonded composite member is separated at the separation layer.

In this method, the single-crystal silicon layer serving as a strained silicon layer advantageously functions to form a high-quality insulating layer on it. This is because the insulating layer can be formed by oxidizing the silicon layer by thermal oxidation. As is apparent to those skilled in the art, a high-quality thermal oxide film can be formed by thermal oxidation.

In the above-described manufacturing method, the separation step can be implemented by various methods. For example, a method of injecting a fluid to the separation layer of the bonded composite member and separating the composite member into two members by the fluid can preferably be used. As the fluid, a gas such as air can be used as well as a liquid such as water. The technique which employs water or a mixture of it as a fluid is known as a water jet method.

A detailed embodiment will be described with reference to FIGS. 5 to 8. The following steps will be described assuming that no single-crystal SiGe layer 14 is formed. When the single-crystal SiGe layer 14 is formed, the sectional structure shown in FIGS. 9 to 12 is obtained.

Figure 5:
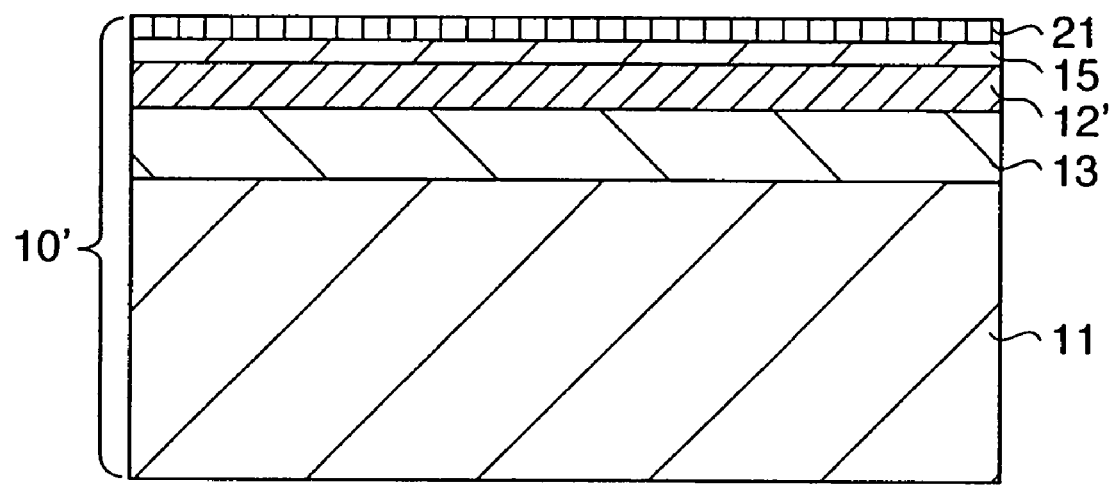
FIG. 5 is a view showing an insulating layer formation step according to the second embodiment.

Next to the step shown in FIG. 3A or 3B, in the step (insulating layer formation step) shown in FIG. 5, an insulating layer 21 is formed on the surface of a first substrate 10 shown in FIG. 3A or 3B. In this step, typically, an insulating film ($SiO_2$ film, in this case) is formed by thermally oxidizing a strained silicon layer (single-crystal silicon layer) 15 on the surface of the first substrate 10 shown in FIG. 3A or 3B by thermal oxidation. The insulating layer 21 may be formed not by thermal oxidation but by CVD. The insulating film need not always be formed. It may be formed on the surface of a second substrate, as will be described later. If the second substrate is made of an insulating material such as transparent glass, the insulating film may be omitted.

Figure 6:
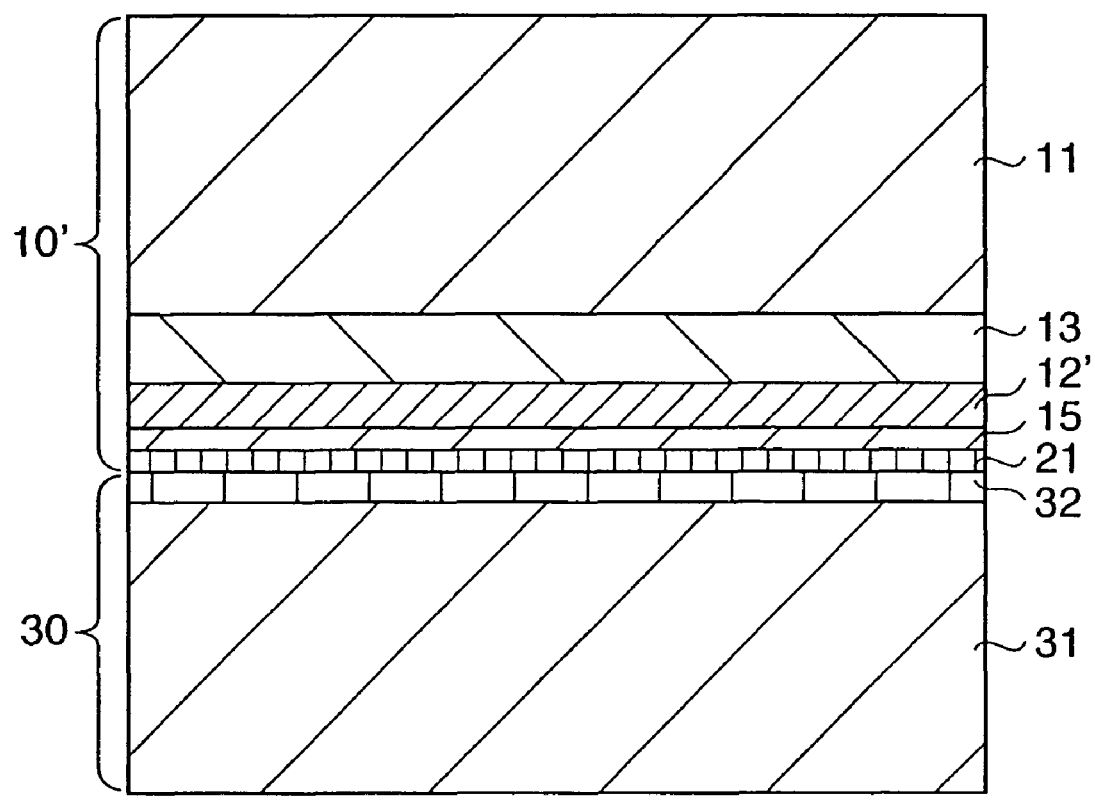
FIG. 6 is a view showing a bonding step (the preprocess of a transfer step) according to the second embodiment.

Next to the step shown in FIG. 5, in the step (bonding step) shown in FIG. 6, a second substrate (member) 30 is bonded to the side of the single-crystal silicon layer 15 or insulating layer 21 of a first substrate (member) 10' on which the insulating layer 21 is formed. The first substrate 10' and second substrate 30 may simply be bonded. Alternatively, to increase the bonding strength of the substrates, anodizing or annealing may be executed. The second substrate 30 is typically a silicon substrate 31 having an insulating layer 32 such as an $SiO_2$ layer formed on its surface. However, the insulating layer 32 need not always be formed. The second substrate 30 need not always be a silicon substrate, either. For example, the second substrate 30 may be a glass substrate.

Figure 7:
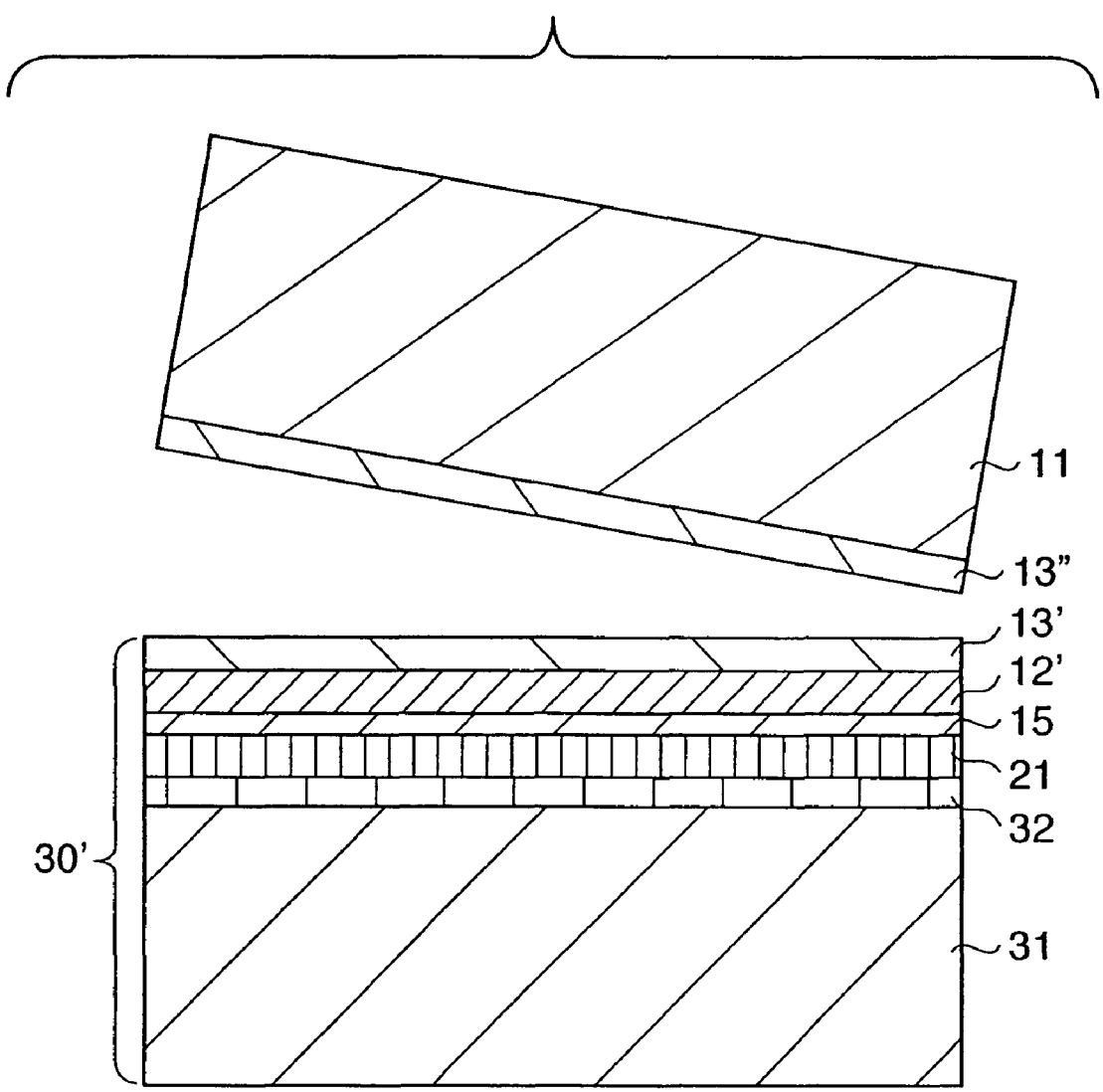
FIG. 7 is a view showing a separation step (the post-process of the transfer step) according to the second embodiment.
Figure 8:
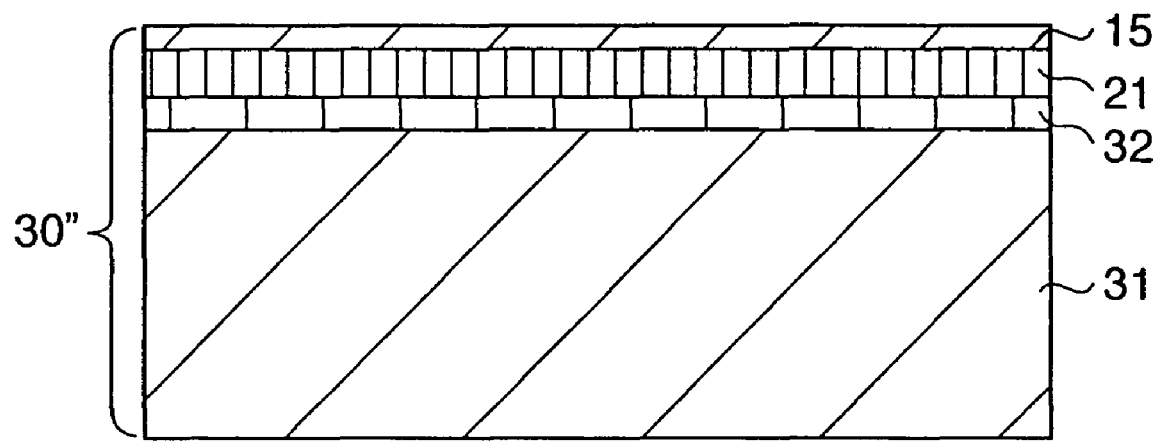
FIG. 8 is a view showing a removal step according to the second embodiment.
Figure 9:
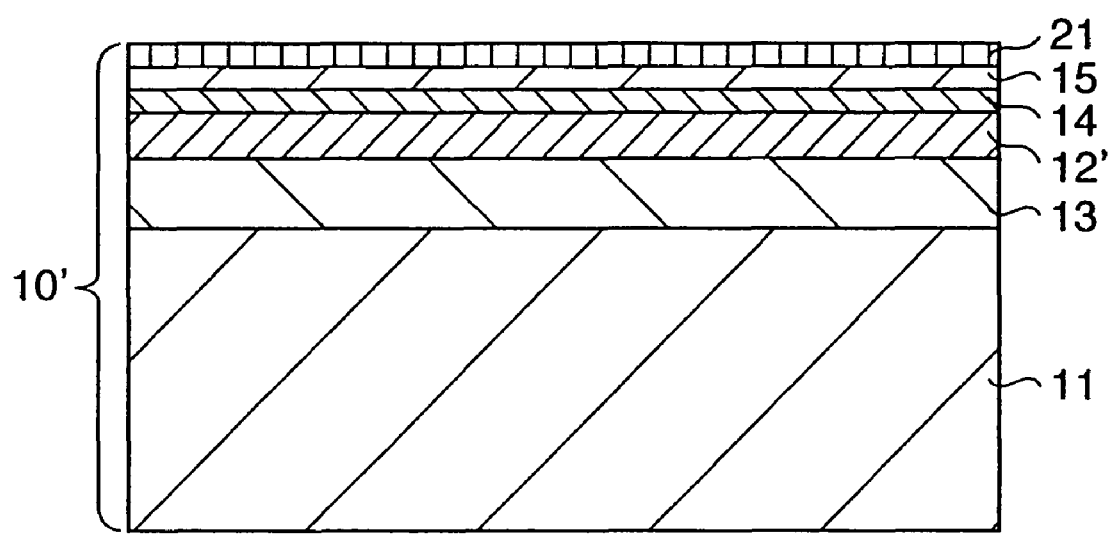
FIG. 9 is a view showing an insulating layer formation step according to a modification to the second embodiment.
Figure 10:
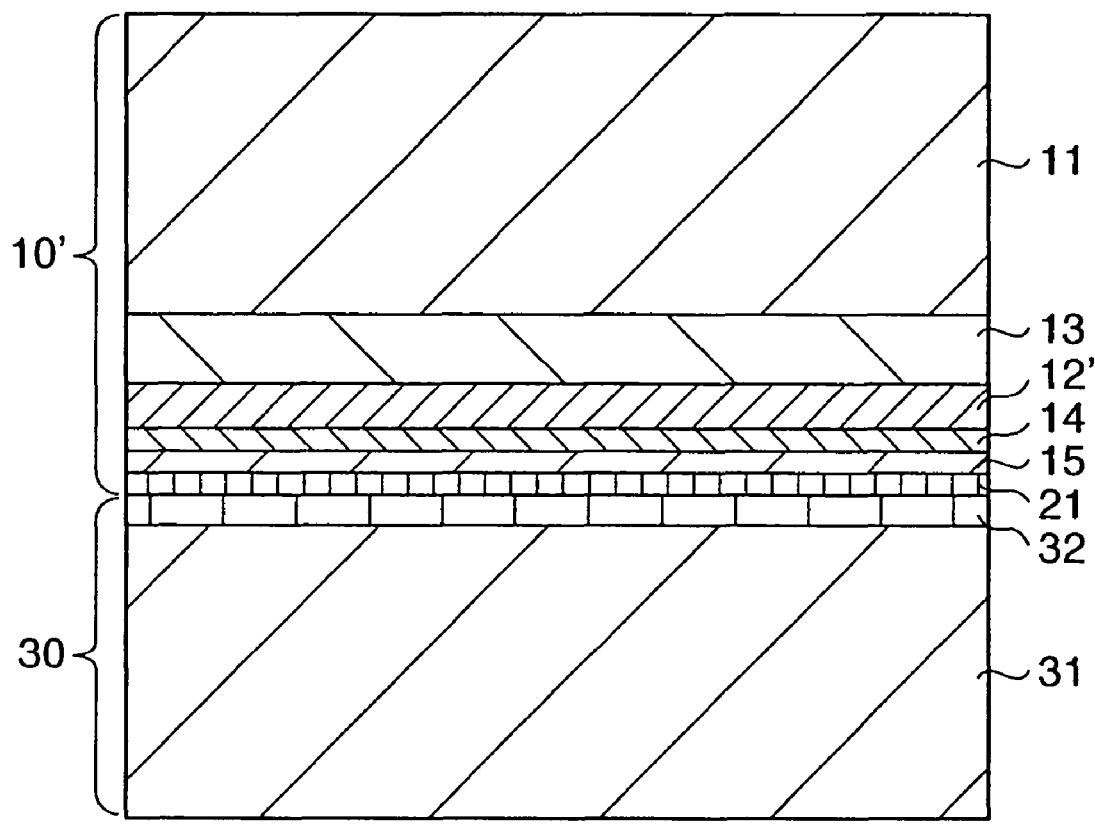
FIG. 10 is a view showing a bonding step (the preprocess of a transfer step) according to the modification to the second embodiment.
Figure 11:
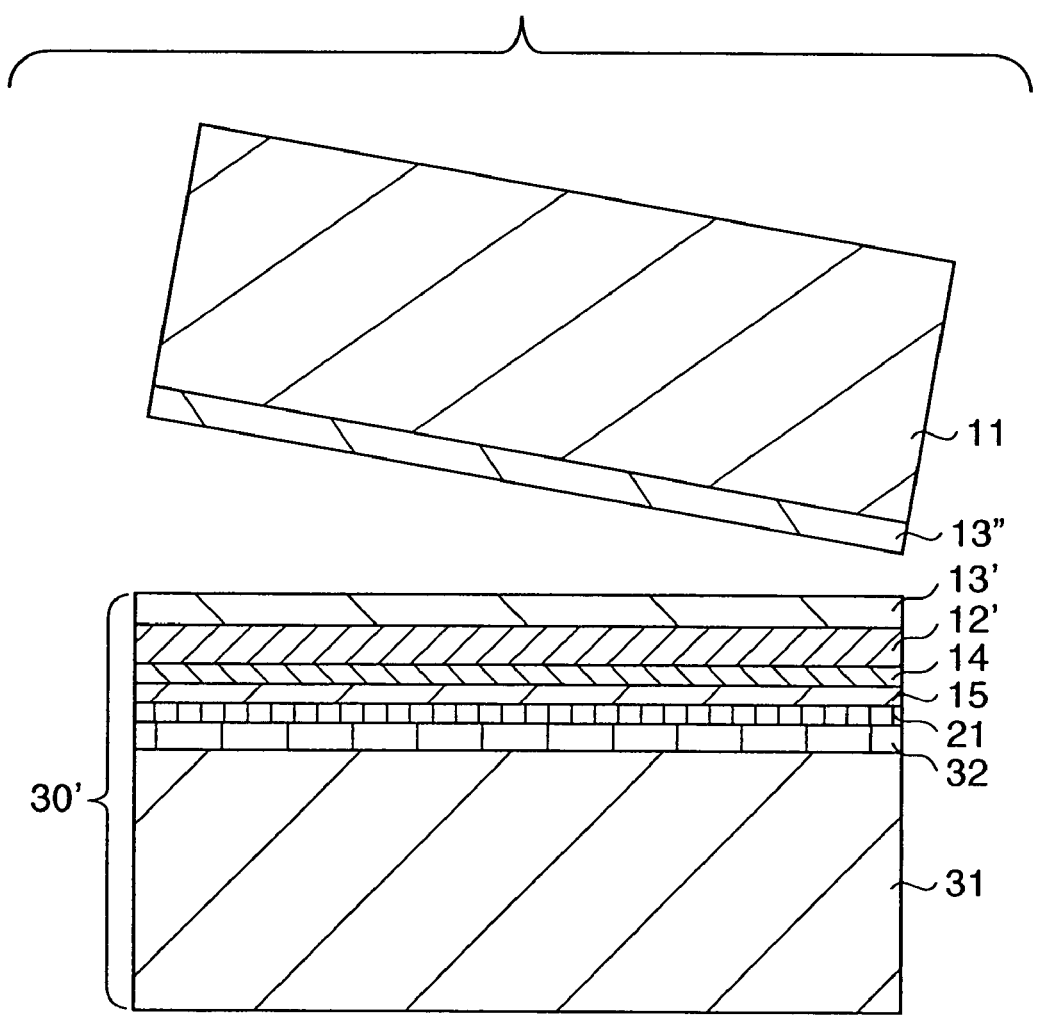
FIG. 11 is a view showing a separation step (the post-process of the transfer step) according to the modification to the second embodiment.

Next to the step shown in FIG. 6, in the step (separation step) shown in FIG. 7, the bonded substrate (bonded substrate stack) is separated into two substrates at the strain induction porous layer 12' or porous silicon layer 13. More specifically, a transfer step is executed by the bonding step shown in FIG. 6 and the separation step shown in FIG. 7. The separation step can be executed by, e.g., injecting a fluid to the separation layer 13 while rotating the bonded substrate about its axis. Reference numerals 13' and 13" schematically indicate porous layers remaining on the substrates after separation.

In place of the separation method using a fluid such as a liquid or gas, a separation method using stress of tension, compression, or shearing may be employed. Alternatively, these methods may be combined. If the strain induction porous layer 12' or porous silicon layer 13' remains on the second substrate 30' after separation, the residual porous layer is preferably removed by etching, polishing, grinding, or annealing in a reducing atmosphere containing hydrogen. If no residue is present, the amount of residue is very small, or the residue poses no problem in the subsequent steps, the removal step need not always be executed.

Separation in the separation step can be done in the strain induction porous silicon layer, in the porous silicon layer formed by porosifying the silicon substrate, or in the interface between the strain induction porous silicon layer and the silicon substrate or the porous silicon layer formed by porosifying the silicon substrate. Alternatively, separation can be done at the defect generation portion in the interface between the strain induction porous silicon layer and the porous silicon layer obtained by porosifying the silicon substrate.

When a circuit element is formed by using the strained silicon layer 15 in a substrate (member) 30" obtained by the above-described steps, a device with a high speed and low power consumption can be obtained. The surface may be planarized by polishing or hydrogen annealing as needed.

In the above-described embodiments, germanium is used as the additional material (the constituent material of the strain inducing material). However, a material containing gallium and arsenic, a material containing gallium and phosphorus, or a material containing gallium and nitrogen may be used.

Third Embodiment

A method of manufacturing a semiconductor substrate (member) according to the third embodiment of the present invention will be described with reference to FIGS. 13 to 15.

Figure 13:
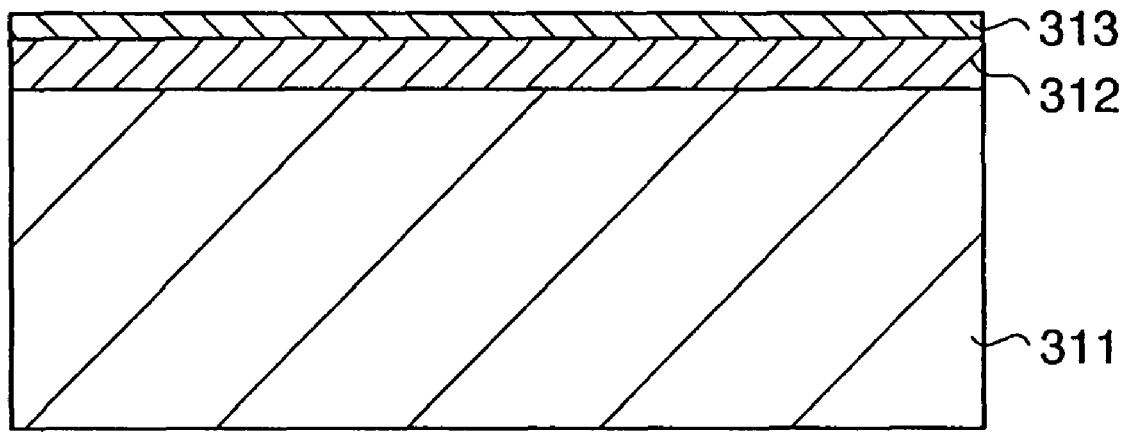
FIG. 13 is a view showing an additional material stacking step according to the third and fourth embodiments.

In the step (stacking step) shown in FIG. 13, a layer 312 containing silicon and germanium (additional material) and a layer 313 are continuously epitaxially grown on a silicon substrate 311.

First, the layer 312 (SiGe layer: for example, Ge=30%) containing silicon and germanium (additional material) is epitaxially grown on the single-crystal silicon substrate 311 by CVD by lamp heating. The conditions are preferably as follows.

Carrier Gas: $H_2$

The flow rate of $H_2$ is preferably 25 to 45 l/min and, typically, 30 l/min.

First Source Gas: $SiH_4$

The flow rate of $SiH_4$ is preferably 50 to 300 sccm and, typically, 100 sccm.

Second Source Gas: 2% $GeH_4$

The flow rate of 2% $GeH_4$ is preferably 20 to 500 sccm and, typically, 300 sccm.

Doping Gas: 0.01% $B_2H_6$ ($H_2$-Diluted)

The flow rate of 0.01% $B_2H_6$ is preferably 10 to 100 sccm and, typically, 30 sccm.

Chamber Pressure

The chamber pressure is preferably 10 to 700 Torr and, typically, 30 to 600 Torr.

Temperature

The temperature is preferably 500° C. to 900° C.

Growth Rate

The growth rate is preferably 5 to 50 nm/min.

The layer is preferably continuously formed by changing the flow rate or concentration of the $GeH_4$ gas gradually or stepwise. More specifically, the composition ratio of Ge is changed depending on the mixture ratio of the source gases. Preferably, the Ge concentration is set low at the early stage of growth on the single-crystal silicon substrate and increased as the epitaxial growth progresses. The Ge ratio is preferably finally set to x=0.1 to 0.5.

Next, the layer 313 (SiGe layer: for example, Ge=20% to 30%) is continuously epitaxially grown on the layer 312 in the same way as described above. The conditions are preferably as follows.

Carrier Gas: $H_2$

The flow rate of $H_2$ is preferably 25 to 45 l/min and, typically, 30 l/min.

First Source Gas: $SiH_4$

The flow rate of $SiH_4$ is preferably 50 to 300 sccm and, typically, 100 sccm.

Second Source Gas: 2% $GeH_4$

The flow rate of 2% $GeH_4$ is preferably 20 to 500 sccm and, typically, 300 sccm.

Chamber Pressure

The chamber pressure is preferably 10 to 700 Torr and, typically, 30 to 600 Torr.

Temperature

The temperature is preferably 500° C. to 900° C.

Growth Rate

The growth rate is preferably 5 to 50 nm/min.

Unlike the layer 312, the layer 313 is formed as without any dopant or increases the resistance by suppressing the dopant to a small amount. In addition, the layer 313 is formed as a thin layer. Hence, the layer 313 changes to a porous layer with a low porosity upon anodizing later and advantageously acts to improve the film quality of the epitaxial layer to be grown on it.

Figure 14:
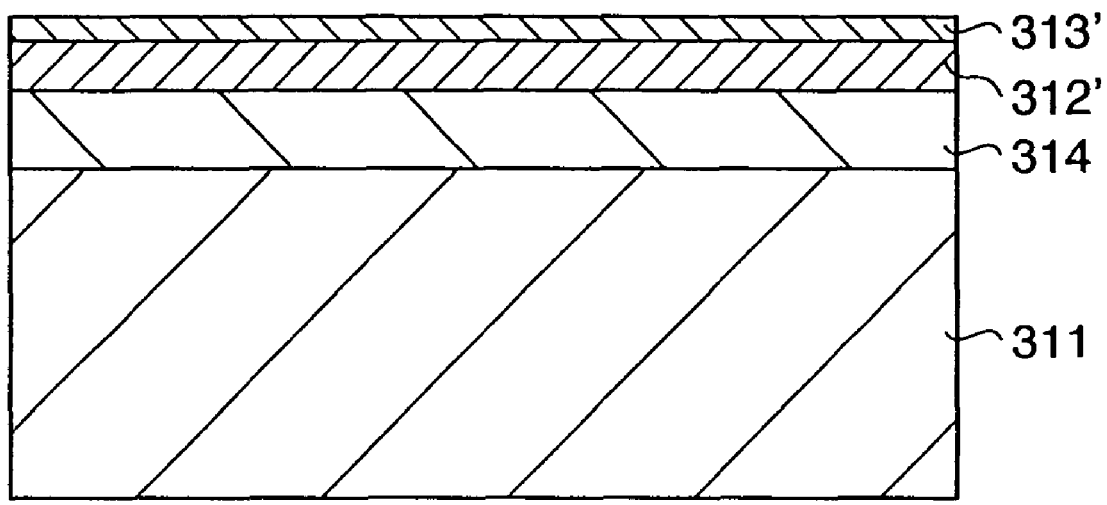
FIG. 14 is a view showing an anodizing step according to the third and fourth embodiments.

Next, the SiGe layers 312 and 313 formed by epitaxial growth are anodized, as shown in FIG. 14. Anodizing can typically be done by filling an anodizing tank having a platinum electrode pair with a solution containing hydrogen fluoride (HF), placing the silicon substrate including the SiGe epitaxial growth layers 312 and 313 between the electrodes, and supplying a current between the electrodes. The structures of porous SiGe layers 312' and 313' formed by this step change in accordance with the doping concentration in the epitaxial growth before anodizing. The layer 313' has a porosity lower than that of the layer 312' and is suitable to grow an Si epitaxial layer on it later. Conditions for anodizing of these SiGe layers are basically determined on the basis of Si porosification conditions disclosed in, e.g., Japanese Patent Laid-Open No. 7-302889 and appropriately set in accordance with the Ge concentration. For the purpose of separating a layer including the Si epitaxial layer to be formed later, a fragile porous silicon layer 314 may simultaneously be formed by porosifying part of the silicon substrate. When the layer structure such as the composition and film thickness and anodizing conditions of the epitaxial SiGe layers 312 and 313 to be porosified later are appropriately selected, the SiGe layers 312 and 313 which have a strain after epitaxial growth can be changed to the porous SiGe layers 312' and 313' with a relaxed strain after anodizing.

Strain relaxation conditions by anodizing are as follows.

Current Density

1 $mA/cm^2$

Anodizing Solution

HF: 42.5%, IPA: 9.2% aqueous solution

Anodizing Time 30 sec

Porosification need not always be executed for the entire SiGe layer. Porosification may be executed in only a partial region of the SiGe layer. In addition, an SiGe epitaxial layer may be grown on the porous SiGe layer 313' as needed. Accordingly, the porous SiGe layers 312' and 313' and the SiGe epitaxial layer can wholly effectively apply a strain to a silicon layer to be grown next.

A single-crystal silicon layer 315 is epitaxially grown on the strain induction porous layers 312' and 313' by CVD.

With the above-described step, a first substrate (member) 300 schematically shown in FIG. 15 is obtained.

Fourth Embodiment

When a semiconductor member having a strained silicon layer obtained by the above-described method is used, strained-SOI having the strained silicon layer on an insulating layer by a transfer method can be manufactured. As already described above, in this application, SOI is short for Semiconductor On Insulator. This embodiment will be described by using silicon as an example of the semiconductor. In the transfer method, a first member having a transfer target layer (including at least two layers) on a separation layer with a fragile structure is bonded to a second member while sandwiching the transfer target layer. After that, the composite member (bonded member) formed by bonding is separated at the separation layer.

According to this method, the transfer target layer is transferred from the first member to the second member such that the lower layer of the transfer target layer formed on the first member becomes the upper layer of the second member, and the upper layer of the transfer target layer formed on the first member becomes the lower layer of the second member. That is, according to this method, the layers sequentially formed on the first member are formed sequentially in a reverse order on the second member.

According to the preferred embodiment of the semiconductor device, layers containing an additional material are continuously formed on a silicon substrate by epitaxial growth. These epitaxial layers are porosified by anodizing. A layer (preferably, a single-crystal silicon layer) mostly made of silicon is formed on the porous layer. An insulating layer is further formed on the layer by thermal oxidation. Next, the second member is bonded to the first member such that the insulating layer is sandwiched between them. Then, the bonded composite member is separated at the separation layer.

In this method, the single-crystal silicon layer serving as a strained silicon layer advantageously functions to form a high-quality insulating layer on it. This is because the insulating layer can be formed by oxidizing the silicon layer by thermal oxidation. As is apparent to those skilled in the art, a high-quality thermal oxide film can be formed by thermal oxidation.

In the above-described manufacturing method, the separation step can be implemented by various methods. For example, a method of injecting a fluid to the separation layer of the bonded composite member and separating the composite member into two members by the fluid can preferably be used. As the fluid, a gas such as air can be used as well as a liquid such as water. The technique which employs water or a mixture of it as a fluid is known as a water jet method.

A detailed embodiment will be described with reference to FIGS. 16 to 19.

Figure 16:
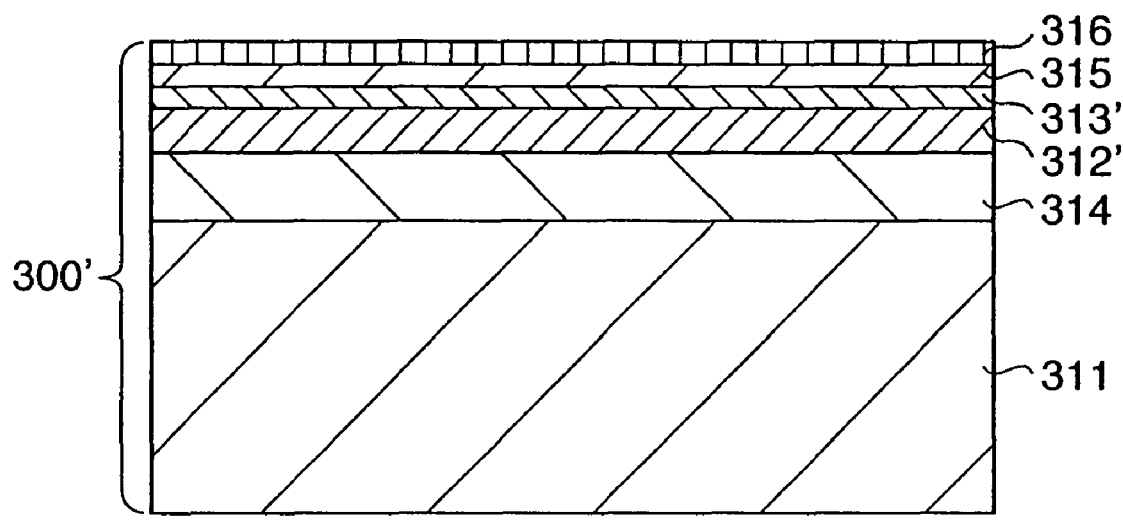
FIG. 16 is a view showing an insulating layer formation step according to the fourth embodiment.

Next to the step shown in FIG. 15, in the step (insulating layer formation step) shown in FIG. 16, an insulating layer 316 is formed on the surface of a first substrate 300 shown in FIG. 15. In this step, typically, an insulating film ($SiO_2$ film, in this case) is formed by thermally oxidizing a strained silicon layer (single-crystal silicon layer) 315 on the surface of the first substrate 300 shown in FIG. 15 by thermal oxidation. The insulating layer 316 may be formed not by thermal oxidation but by CVD. The insulating film need not always be formed. It may be formed on the surface of a second substrate, as will be described later. If the second substrate is made of an insulating material such as transparent glass, the insulating film may be omitted.

Figure 17:
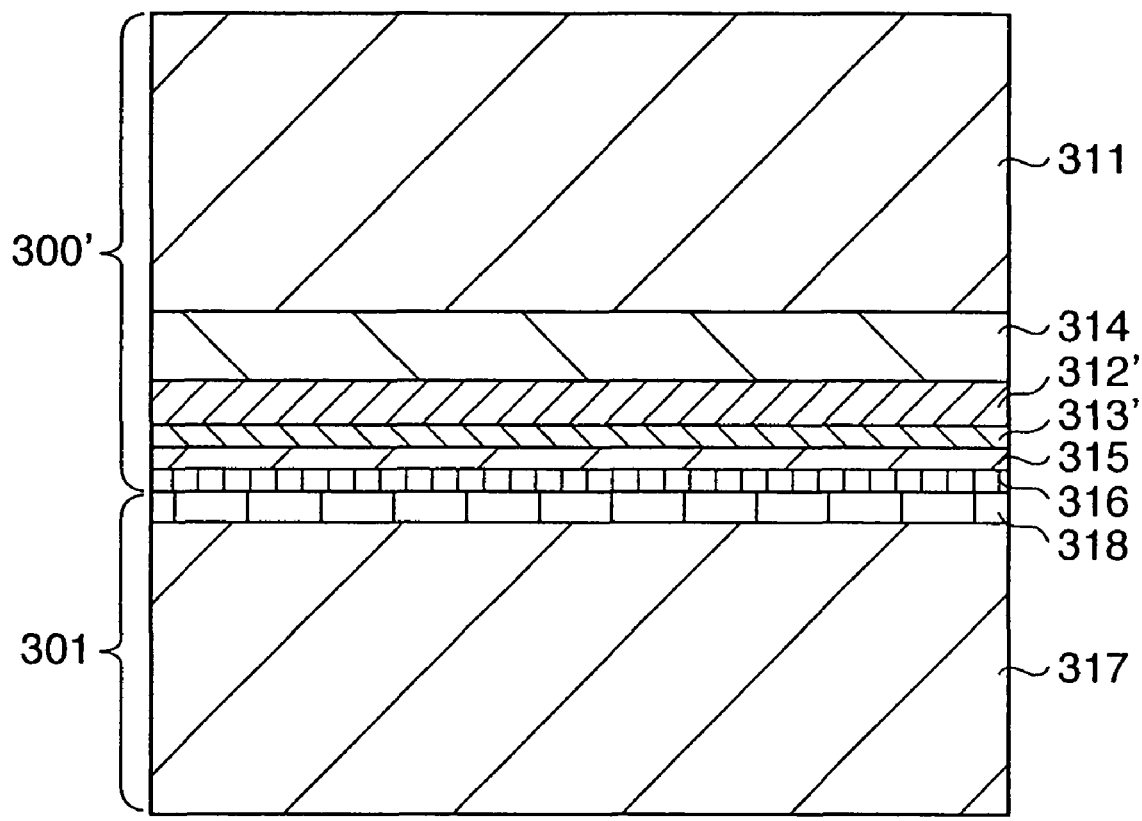
FIG. 17 is a view showing a bonding step (the preprocess of a transfer step) according to the fourth embodiment.

Next to the step shown in FIG. 16, in the step (bonding step) shown in FIG. 17, a second substrate (member) 301 is bonded to the side of the single-crystal silicon layer 315 or insulating layer 316 of a first substrate (member) 300' on which the insulating layer 316 is formed. The first substrate 300' and second substrate 301 may simply be bonded. Alternatively, to increase the bonding strength of the bonded substrates, anodizing or annealing may be executed. The second substrate 301 is typically a silicon substrate 317 having an insulating layer 318 such as an $SiO_2$ layer formed on its surface. However, the insulating layer 318 need not always be formed. The second substrate 301 need not always be a silicon substrate, either. For example, the second substrate 301 may be a glass substrate.

Figure 18:
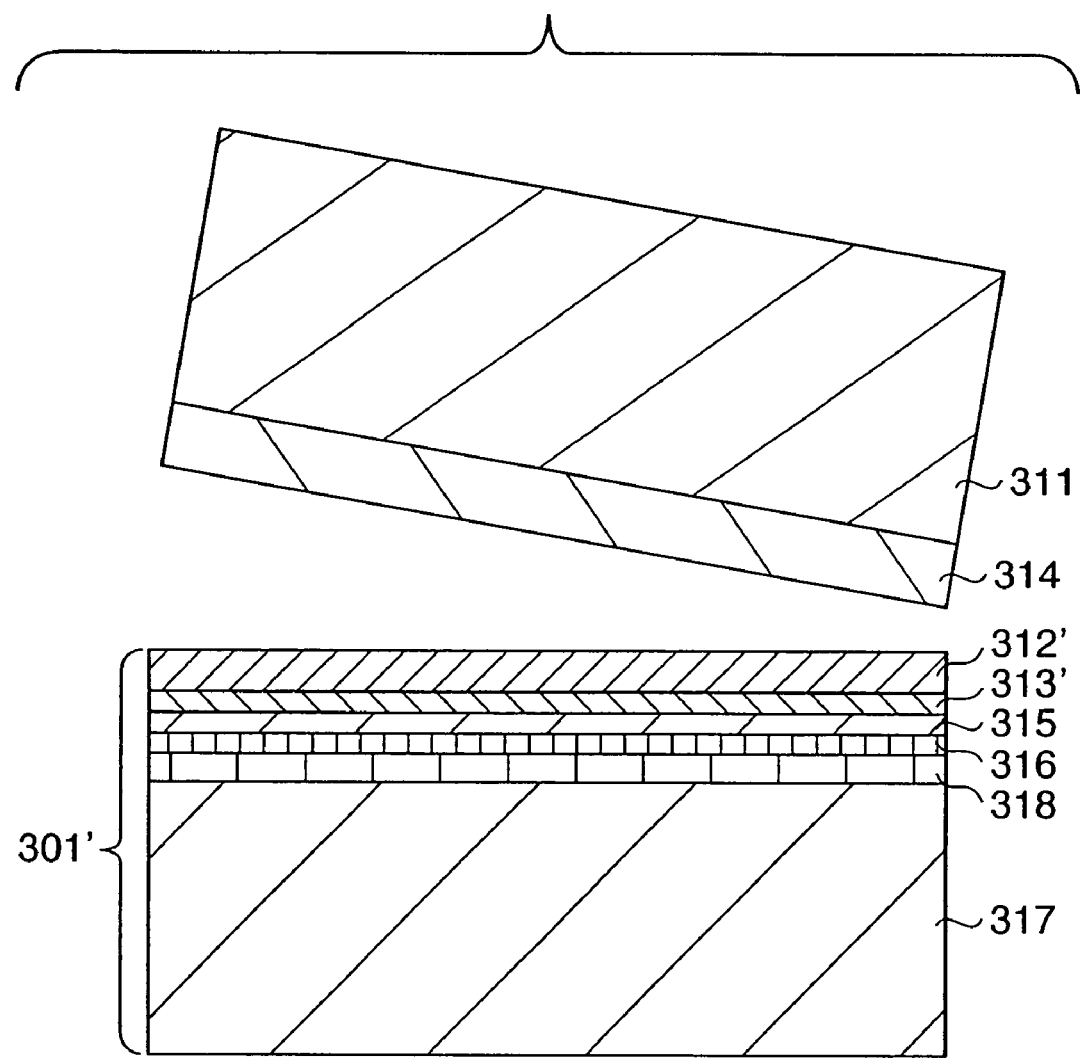
FIG. 18 is a view showing a separation step (the post-process of the transfer step) according to the fourth embodiment.

Next to the step shown in FIG. 17, in the step (separation step) shown in FIG. 18, the substrate (bonded substrate stack) formed by bonding is separated into two substrates at the strain inducing porous layer 312', a porous silicon layer 314, or the interface between these layers. More specifically, a transfer step is executed by the bonding step shown in FIG. 17 and the separation step shown in FIG. 18. The separation step can be executed by, e.g., injecting a fluid to the separation layer portions 312' and 314 while rotating the bonded substrate about its axis.

In place of the separation method using a fluid such as a liquid or gas, a separation method using stress of tension, compression, or shearing may be employed. Alternatively, these methods may be combined. If the strain inducing porous layer 312' or 313' or the porous silicon layer 314' remains on the second substrate 301' after separation, the residual porous layer is preferably removed by etching, polishing, grinding, or annealing in a reducing atmosphere containing hydrogen. If no residue is present, the amount of residue is very small, or the residue poses no problem in the subsequent steps, the removal step need not always be executed.

Separation in the separation step can be done in the strain inducing porous layer, in the porous silicon layer formed by porosifying the silicon substrate, or in the interface between the strain inducing porous layer and the silicon substrate or the porous silicon layer formed by porosifying the silicon substrate. Alternatively, separation can be done at the defect generation portion in the interface between the strain inducing porous layer and the porous silicon layer obtained by porosifying the silicon substrate.

When a circuit element is formed by using the strained silicon layer 315 in a substrate (member) 301" obtained by the above-described steps, a device with a high speed and low power consumption can be obtained. The surface may be planarized by polishing or hydrogen annealing as needed. In the above-described step, an SiGe epitaxial layer may be grown on the porous SiGe layer 313' as needed. Accordingly, the porous SiGe layers 312' and 313' and the SiGe epitaxial layer can wholly effectively apply a strain to a silicon layer to be grown next, and in this state, strained-SOI can be manufactured. In the above-described embodiment, germanium is used as the additional material (the constituent material of the strain induction material). However, a material containing gallium and arsenic, a material containing gallium and phosphorus, or a material containing gallium and nitrogen may be used. The semiconductor member of the present invention and the manufacturing method thereof have been described above. A semiconductor device using the semiconductor member of the embodiment will be described next.

Example 1 of Semiconductor Device

Figure 20:
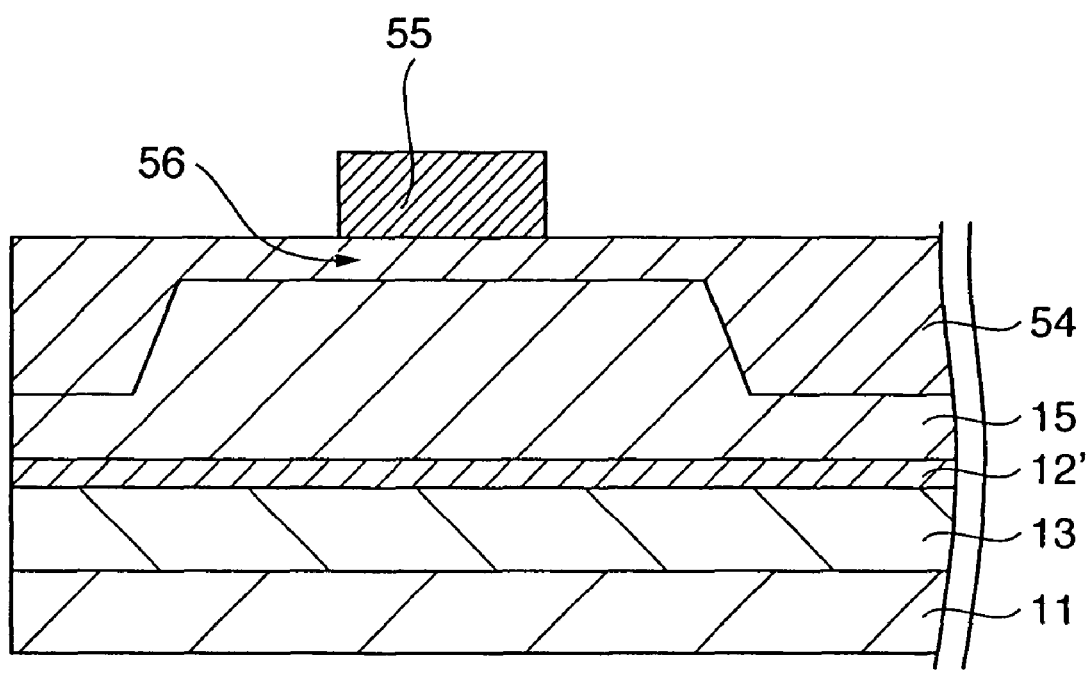
FIG. 20 is a view showing Example 1 of a semiconductor device and a manufacturing method thereof.

FIGS. 20 to 23 show, as an example, a structure near a semiconductor layer 14 of the substrate manufactured by the steps according to the first embodiment. A description will be made below assuming that no single-crystal SiGe layer 14 is formed. When the single-crystal SiGe layer 14 is formed, the sectional structure shown in FIGS. 24 to 27 is obtained. First, an element isolation region 54 and gate insulating film 56 are formed on the surface of the semiconductor layer 14 (FIG. 20). As the material of the gate insulating film 56, for example, silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or mixture glass thereof can suitably be used. The gate oxide film 56 can be formed by, e.g., oxidizing the surface of the semiconductor layer 14 or depositing an appropriate substance on the surface of the semiconductor layer 14 by CVD or PVD.

A gate electrode 55 is formed on the gate insulating film 56. The gate electrode 55 can be made of, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate electrode 55 may be formed by forming a plurality of layers made of different materials, like a polycide gate. The gate electrode 55 may be formed by, e.g., a method called salicide (self-aligned silicide), a method called a damascene gate process, or any other method. With the above-described step, the structure shown in FIG. 20 is obtained.

Figure 21:
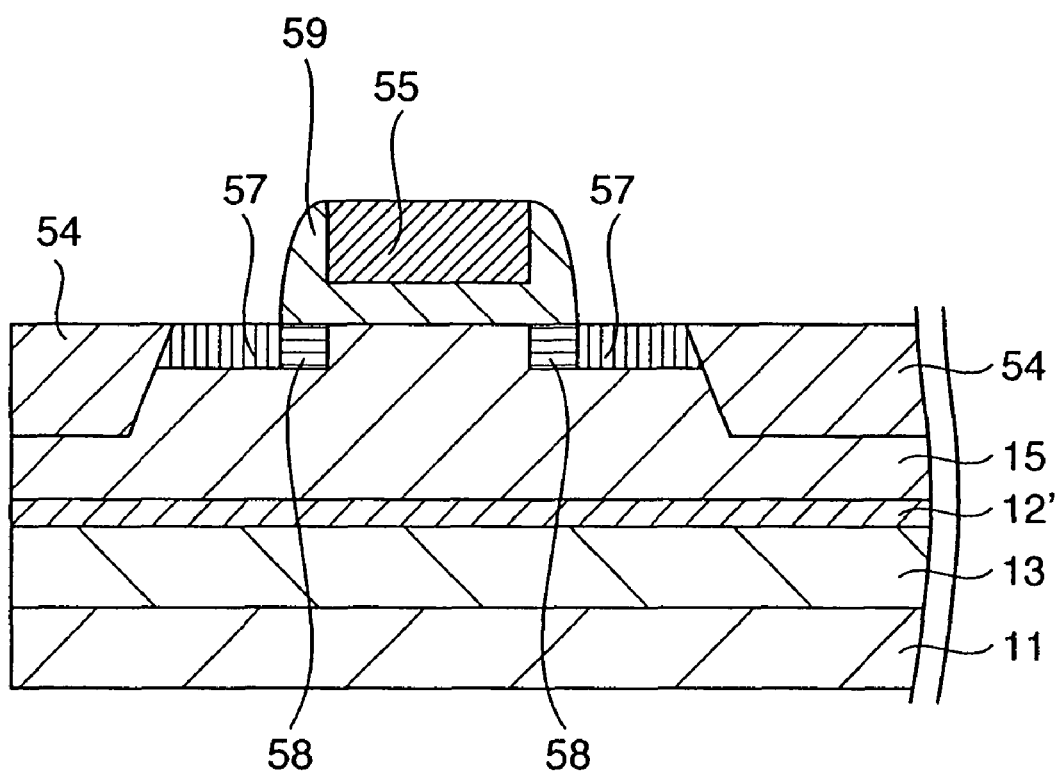
FIG. 21 is a view showing Example 1 of the semiconductor device and the manufacturing method thereof.

An n-type impurity such as phosphorus, arsenic, or antimony or a p-type impurity such as boron is introduced into the semiconductor layer 14 to form relatively lightly doped source and drain regions 58 (FIG. 21). The impurity can be introduced by, e.g., ion implantation and annealing.

An insulating film is formed to cover the gate electrode 55 and etched back to form a sidewall 59 on the side portion of the gate electrode 55.

An impurity of the same conductivity type as the above-described impurity is introduced into the semiconductor layer 14 to form relatively heavily doped source and drain regions 57. With the above-described step, the structure shown in FIG. 21 is obtained.

Figure 22:
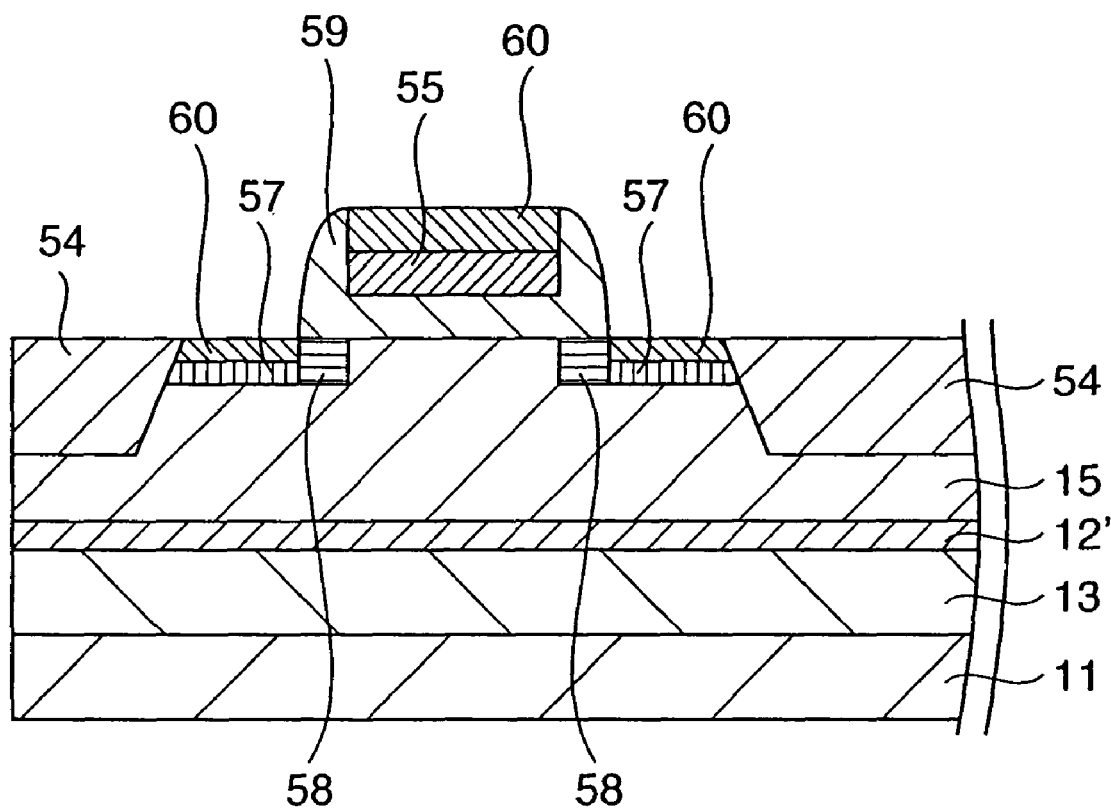
FIG. 22 is a view showing Example 1 of the semiconductor device and the manufacturing method thereof.

A metal silicide layer 60 is formed on the upper surface of the gate electrode 55 and the upper surfaces of the source and drain regions 57 (FIG. 22). As the material of the metal silicide layer 60, e.g., nickel silicide, titanium silicide, cobalt silicide, molybdenum silicide, or tungsten silicide can suitably be used. These silicides can be formed by depositing a metal to cover the upper surface of the gate electrode 55 and the upper surfaces of the source and drain regions 57, executing annealing to cause the metal and underlying silicon to react with each other, and removing an unreacted portion of the metal by an etchant such as sulfuric acid. The surface of the silicide layer may be nitrided as needed. With the above-described step, the structure shown in FIG. 22 is obtained.

Figure 23:
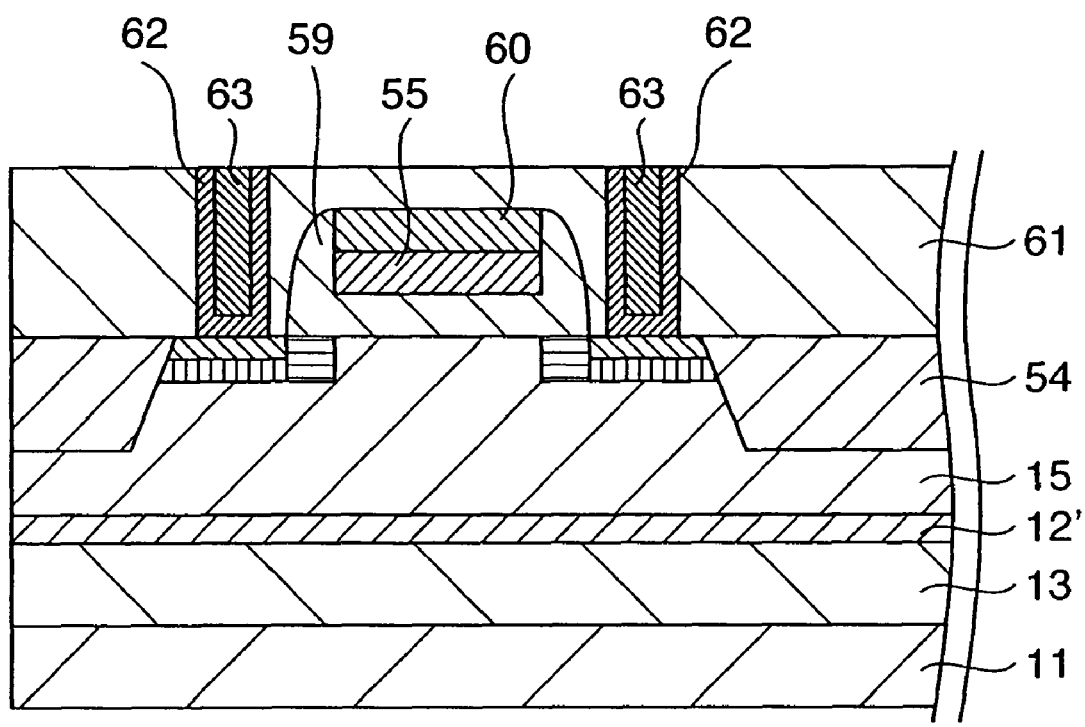
FIG. 23 is a view showing Example 1 of the semiconductor device and the manufacturing method thereof.
Figure 24:
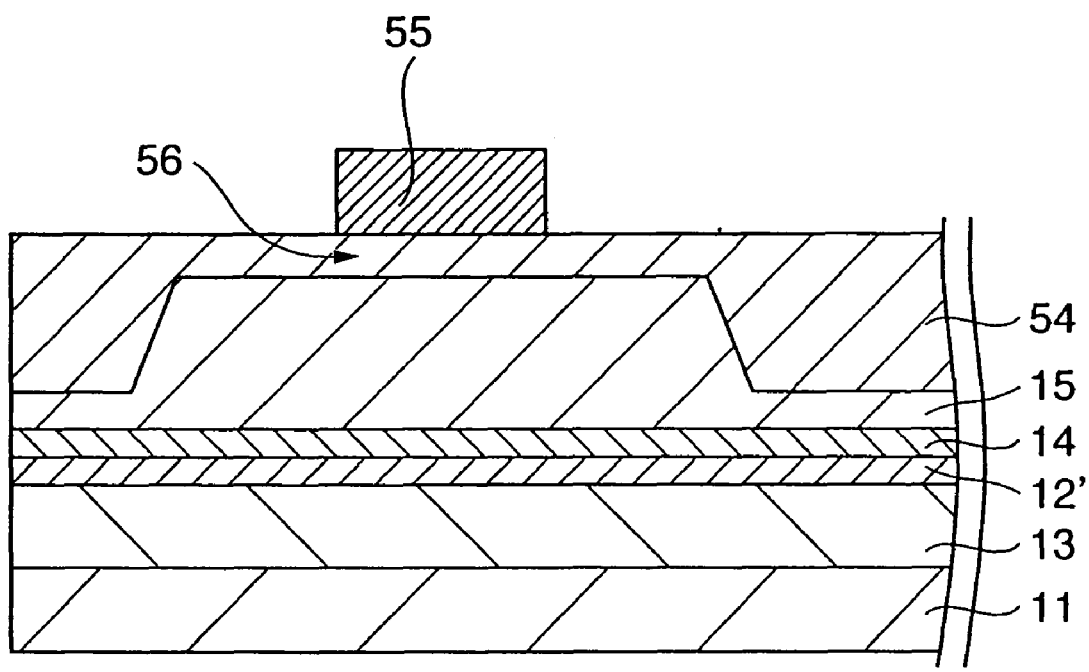
FIG. 24 is a view showing a modification of Example 1 of the semiconductor device and the manufacturing method thereof.
Figure 25:
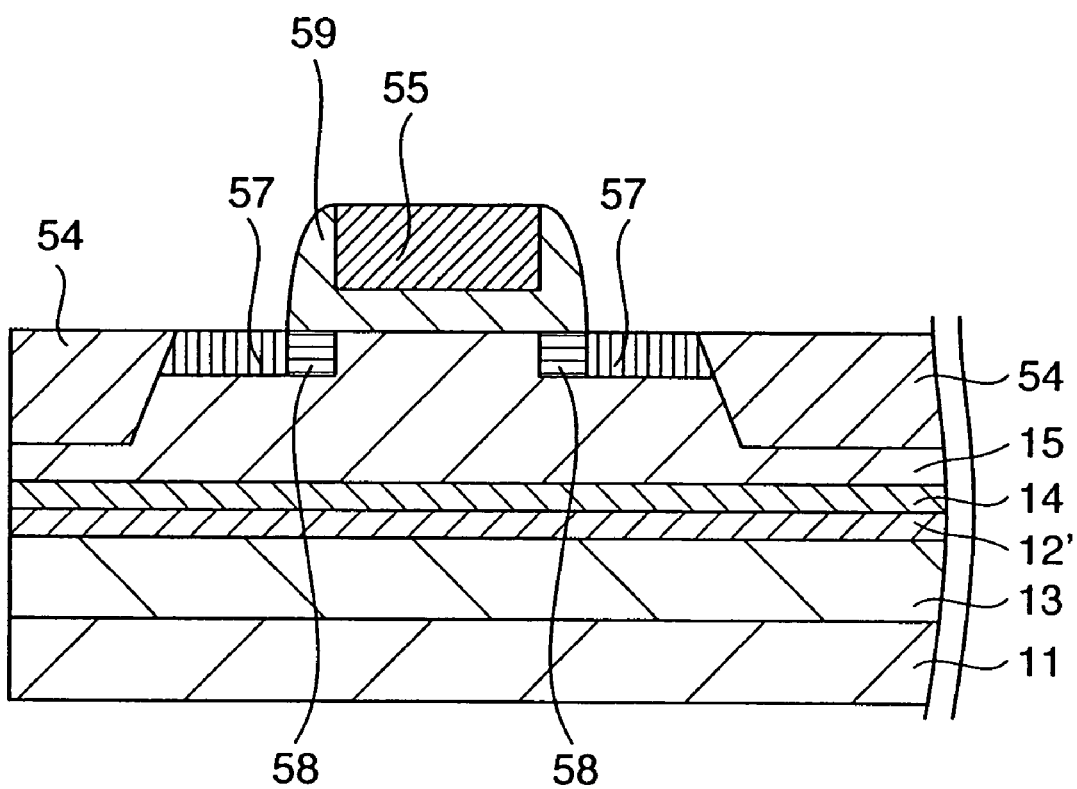
FIG. 25 is a view showing the modification of Example 1 of the semiconductor device and the manufacturing method thereof.
Figure 26:
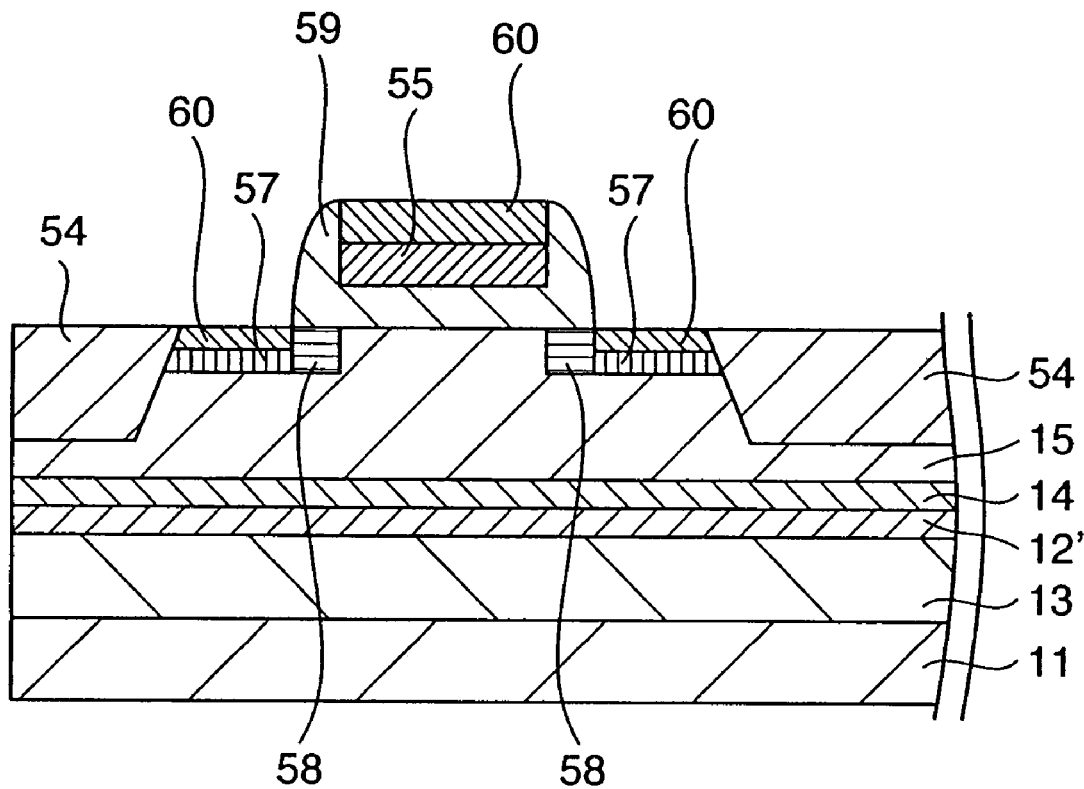
FIG. 26 is a view showing the modification of Example 1 of the semiconductor device and the manufacturing method thereof.
Figure 27:
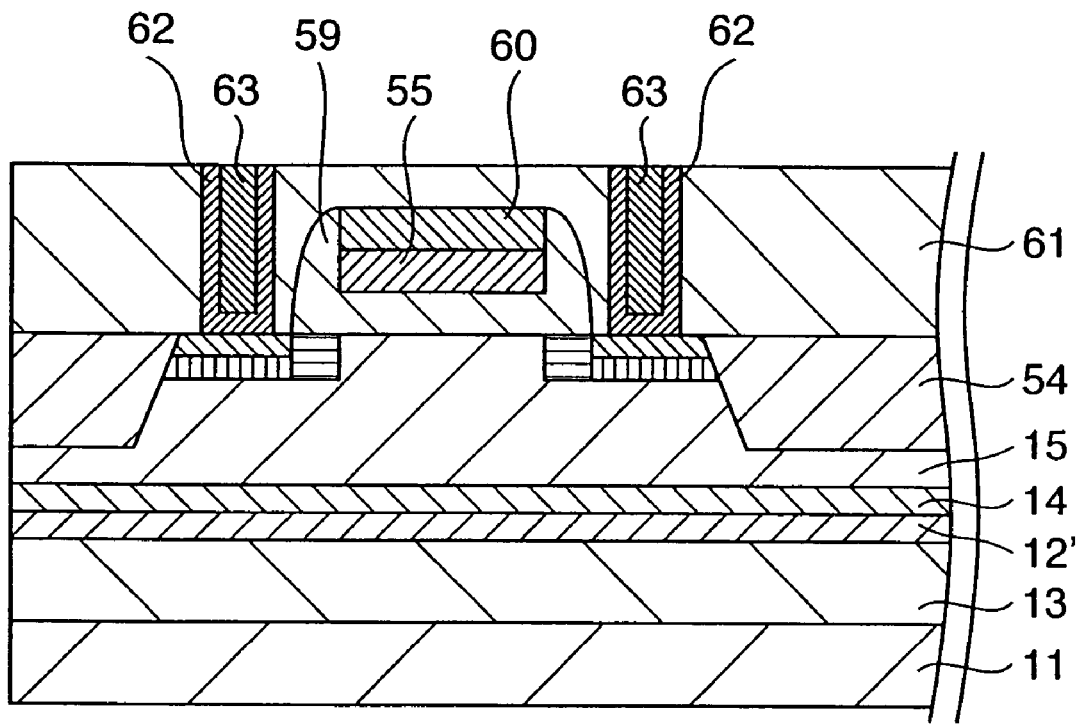
FIG. 27 is a view showing the modification of Example 1 of the semiconductor device and the manufacturing method thereof.

An insulating film 61 is formed to cover the upper surface of the gate electrode converted into a silicide and the upper surfaces of the source and drain regions (FIG. 23). As the material of the insulating film 61, silicon oxide containing phosphorus and/or boron can suitably be used.

After the surface is planarized by CMP (Chemical Mechanical Polishing) as needed, contact holes are formed in the insulating film 61. When photolithography using KrF excimer laser, ArF excimer laser, $F_2$ excimer laser, electron beam, or X-rays is used, a rectangular contact hole having a side shorter than 0.25 μm or a circular contact hole having a diameter smaller than 0.25 μm can be formed.

The contact holes are filled with a conductor. As a conductor filling method, suitably, after a film of a refractory metal or a nitride thereof is formed on the inner surface of the contact hole as a barrier metal 62, a conductor 63 such as a tungsten alloy, aluminum, aluminum alloy, copper, or copper alloy is deposited by CVD, PVD (Physical Vapor Deposition), or plating. A conductor deposited higher than the upper surface of the insulating film 61 may be removed by etch back or CMP. Before the contact holes are filled with the conductor, the surface of the silicide in the source and drain regions exposed to the bottom portions of the contact holes may be nitrided. With the above-described step, a transistor such as an FET (Field Effect Transistor) can be formed on the strained-Si layer so that a semiconductor device having a transistor having the structure shown in FIG. 23 is obtained.

As described above, according to this embodiment, the carrier mobility of the semiconductor layer can be increased by using the strained silicon layer. For this reason, a device such as a transistor formed on the semiconductor layer can be driven at a high speed.

Example 2 of Semiconductor Device

A semiconductor device (device) using a semiconductor substrate prepared by the manufacturing method described in the second embodiment and a manufacturing method thereof will be described next with reference to FIGS. 28 to 31.

First, a semiconductor substrate is manufactured by using the semiconductor substrate (member) manufacturing method exemplified as the second embodiment. This semiconductor substrate has a strained-Si layer on a buried oxide film (insulating film), as described above. Such a semiconductor substrate (to be referred to as a strained-SOI substrate hereinafter) having the strained-Si/insulating layer structure has received a great deal of attention because a device with a higher speed and lower power consumption can be obtained as compared to a normal SOI substrate having an single-crystal Si/insulating layer structure. This is because the strained-Si layer is superior to an Si layer without strain.

Figure 28:
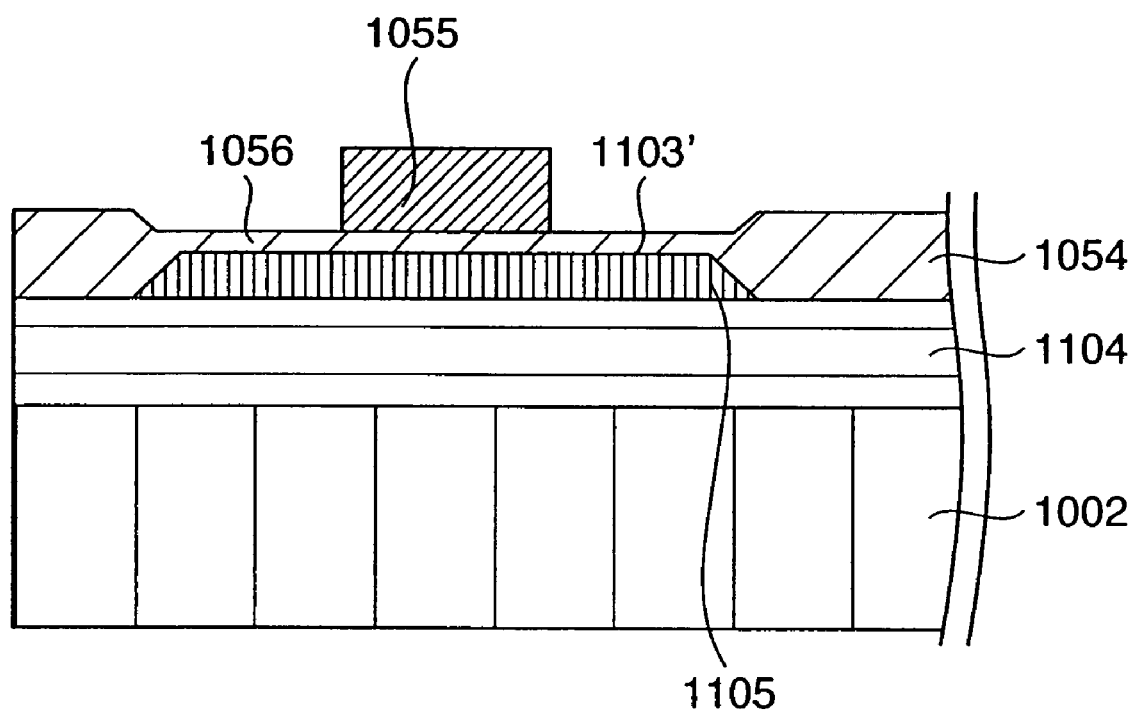
FIG. 28 is a view showing Example 2 of a semiconductor device and a manufacturing method thereof.

In the step shown in FIG. 28, an active region 1103' in which a transistor should be formed and an element isolation region 1054 are formed on a prepared strained-SOI substrate. More specifically, the active region 1103' and element isolation region 1054 can be formed by, e.g., a method of patterning a strained-Si layer 1105 on a buried insulating film 1104 into an island shape, a LOCOS oxidation method, or a trench method.

A gate insulating film 1056 is formed on the surface of the strained-Si layer 1105. As the material of the gate insulating film 1056, for example, silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or mixture glass thereof can suitably be used. The gate insulating film 1056 can be formed by, e.g., oxidizing the surface of the strained-Si layer 1105 or depositing an insulating substance on the strained-Si layer 1105 by CVD or PVD.

A gate electrode 1055 is formed on the gate insulating film 1056. The gate electrode 1055 can be made of, e.g., polysilicon doped with a p- or n-type impurity, a metal such as a tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate electrode 1055 may be formed by forming a plurality of layers made of different materials, like a polycide gate. The gate electrode 1055 may be formed by, e.g., a method called salicide (self-aligned silicide), a method called a damascene gate process, or any other method. With the above-described step, the structure shown in FIG. 28 is obtained.

Figure 29:
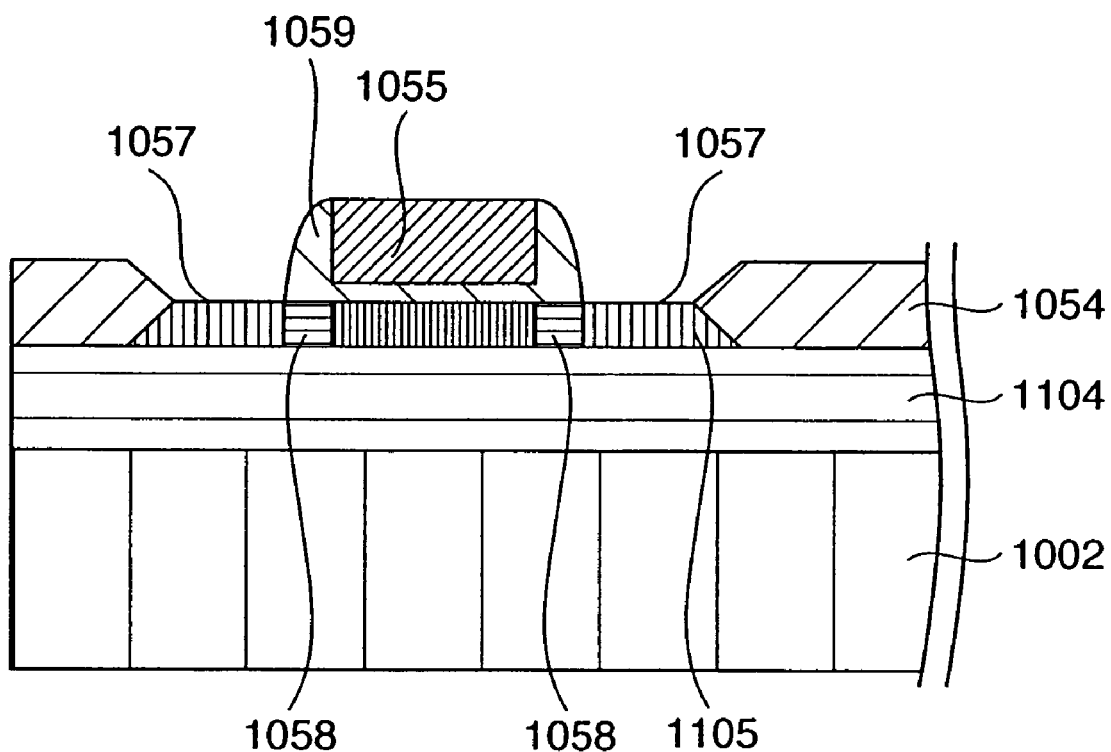
FIG. 29 is a view showing Example 2 of the semiconductor device and the manufacturing method thereof.

In the step shown in FIG. 29, an n-type impurity such as phosphorus, arsenic, or antimony or a p-type impurity such as boron is introduced into the active region 1103' to form relatively lightly doped source and drain regions 1058. The impurity can be introduced by, e.g., ion implantation and annealing.

An insulating film is formed to cover the gate electrode 1055 and etched back to form a sidewall 1059 on the side portion of the gate electrode 1055.

An impurity of the same conductivity type as the above-described impurity is introduced into the active region 1103' to form relatively heavily doped source and drain regions 1057. With the above-described step, the structure shown in FIG. 29 is obtained.

Figure 30:
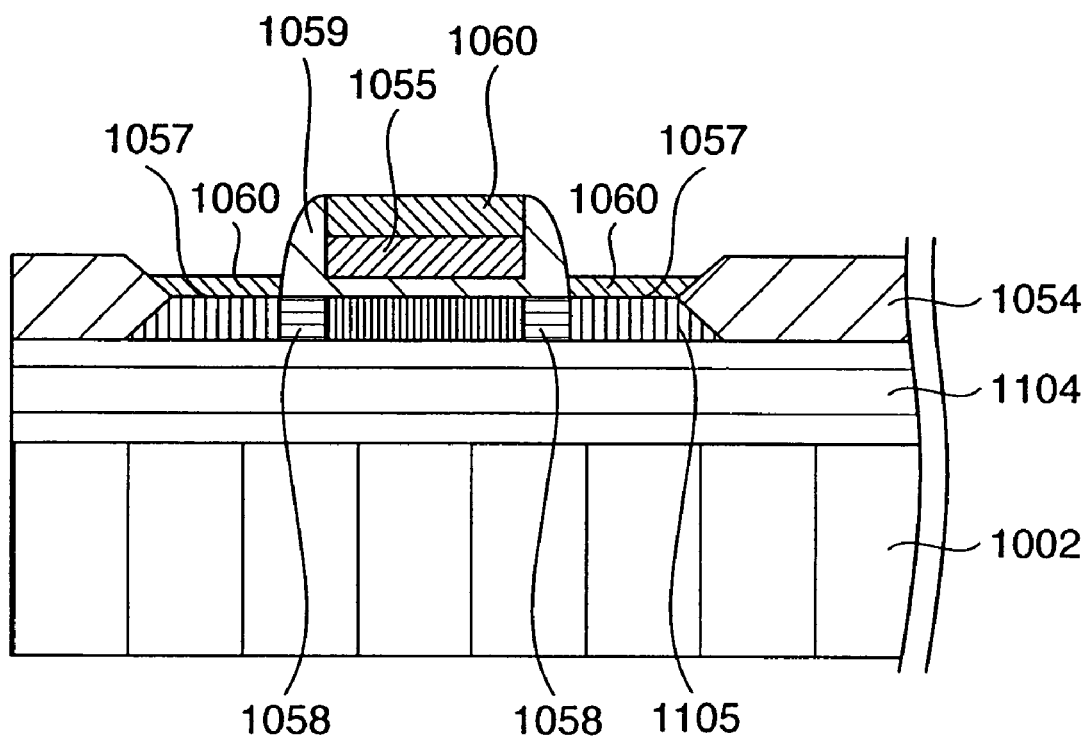
FIG. 30 is a view showing Example 2 of the semiconductor device and the manufacturing method thereof.

In the step shown in FIG. 30, a metal silicide layer 1060 is formed on the upper surface of the gate electrode 1055 and the upper surfaces of the source and drain regions 1057. As the material of the metal silicide layer 1060, e.g., nickel silicide, titanium silicide, cobalt silicide, molybdenum silicide, or tungsten silicide can suitably be used. These silicides can be formed by depositing a metal to cover the upper surface of the gate electrode 1055 and the upper surfaces of the source and drain regions 1057, executing annealing to cause the metal and underlying silicon to react with each other, and removing an unreacted portion of the metal by an etchant such as sulfuric acid. The surface of the silicide layer may be nitrided as needed. With the above-described step, the structure shown in FIG. 30 is obtained.

Figure 31:
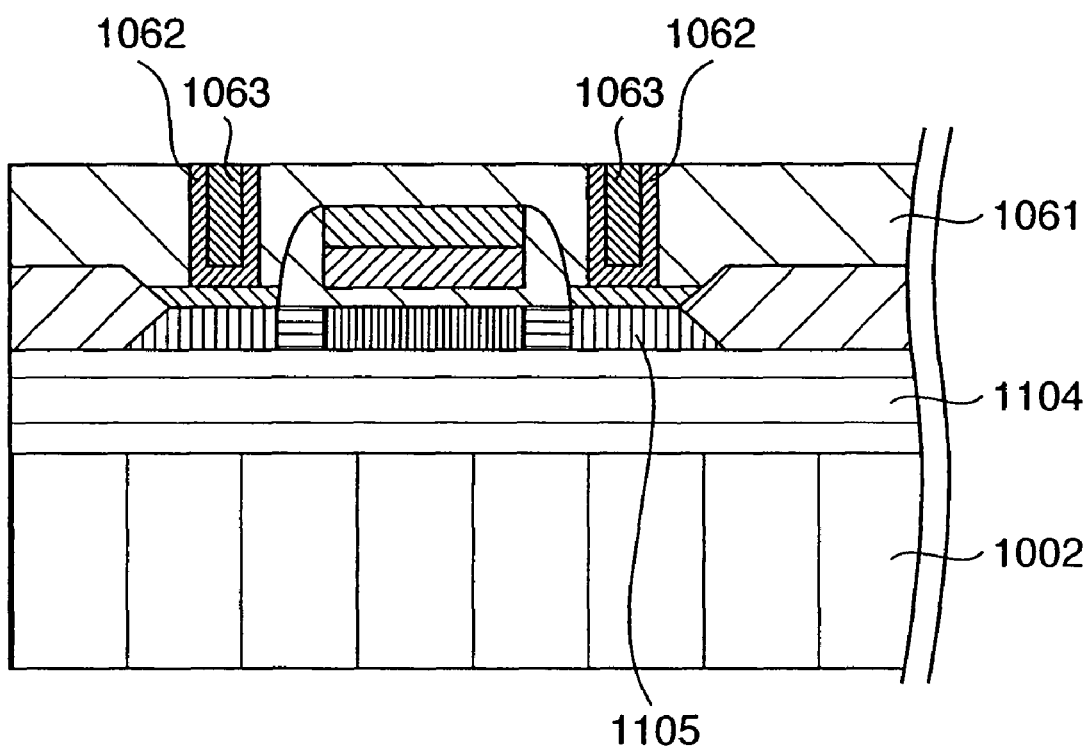
FIG. 31 is a view showing Example 2 of the semiconductor device and the manufacturing method thereof.

In the step shown in FIG. 31, an insulating film 1061 is formed to cover the upper surface of the gate electrode converted into a silicide and the upper surfaces of the source and drain regions. As the material of the insulating film 1061, silicon oxide containing phosphorus and/or boron can suitably be used.

After the surface is planarized by CMP as needed, contact holes are formed in the insulating film 1061. When photolithography using KrF excimer laser, ArF excimer laser, $F_2$ excimer laser, electron beam, or X-rays is used, a rectangular contact hole having a side shorter than 0.25 μm or a circular contact hole having a diameter smaller than 0.25 μm can be formed.

The contact holes are filled with a conductor. As a conductor filling method, suitably, after a film of a refractory metal or a nitride thereof is formed on the inner surface of the contact hole as a barrier metal 1062 as needed, a conductor 1063 such as a tungsten alloy, aluminum, aluminum alloy, copper, or copper alloy is deposited by CVD, PVD, or plating. A conductor deposited higher than the upper surface of the insulating film 1061 may be removed by etch back or CMP. Before the contact holes are filled with the conductor, the surface of the silicide in the source and drain regions exposed to the bottom portions of the contact holes may be nitrided. With the above-described step, a transistor such as a FET can be formed on the strained-Si layer on the strained-SOI substrate so that a semiconductor device having a transistor having the structure shown in FIG. 31 is obtained.

The thickness and impurity concentration of the active layer (strained-Si layer) 1103' are determined such that the depletion layer which spreads under the gate insulating film upon voltage application to the gate electrode reaches the upper surface of the buried insulating film 1014. Accordingly, the formed transistor operates as a fully depleted transistor. When the thickness and impurity concentration of the active layer (strained-Si layer) 1103' are determined such that the depletion layer does not reach the upper surface of the buried insulating film 1014, the formed transistor (insulating gate field effect transistor) operates as a partially depleted transistor.

FIGS. 28 to 31 show only one transistor region. To obtain a semiconductor device which achieve a desired function, a number of transistors or other circuit elements may be formed on the strained-SOI substrate, and interconnections therebetween may be formed.

Example 3 of Semiconductor Device

Figure 32:
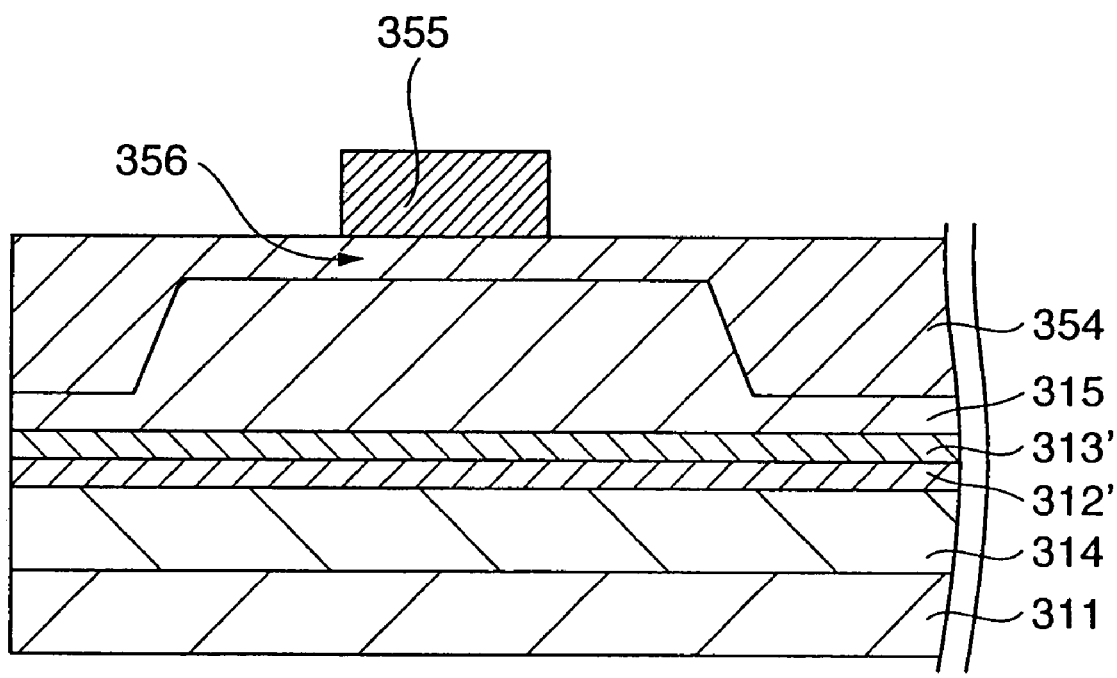
FIG. 32 is a view showing Example 3 of a semiconductor device and a manufacturing method thereof.

FIGS. 32 to 35 show, as an example, a structure near a semiconductor layer 315 of the substrate manufactured by the steps according to the third embodiment. First, an element isolation region 354 and gate insulating film 356 are formed on the surface of the semiconductor layer 315 (FIG. 32). As the material of the gate insulating film 356, for example, silicon oxide, silicon nitride, silicon oxynitride, aluminum oxide, tantalum oxide, hafnium oxide, titanium oxide, scandium oxide, yttrium oxide gadolinium oxide, lanthanum oxide, zirconium oxide, or mixture glass thereof can suitably be used. The gate oxide film 356 can be formed by, e.g., oxidizing the surface of the semiconductor layer 315 or depositing an appropriate substance on the surface of the semiconductor layer 315 by CVD or PVD.

A gate electrode 355 is formed on the gate insulating film 356. The gate electrode 355 can be made of, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate electrode 355 may be formed by forming a plurality of layers made of different materials, like a polycide gate. The gate electrode 355 may be formed by, e.g., a method called salicide (self-aligned silicide), a method called a damascene gate process, or any other method. With the above-described step, the structure shown in FIG. 32 is obtained.

Figure 33:
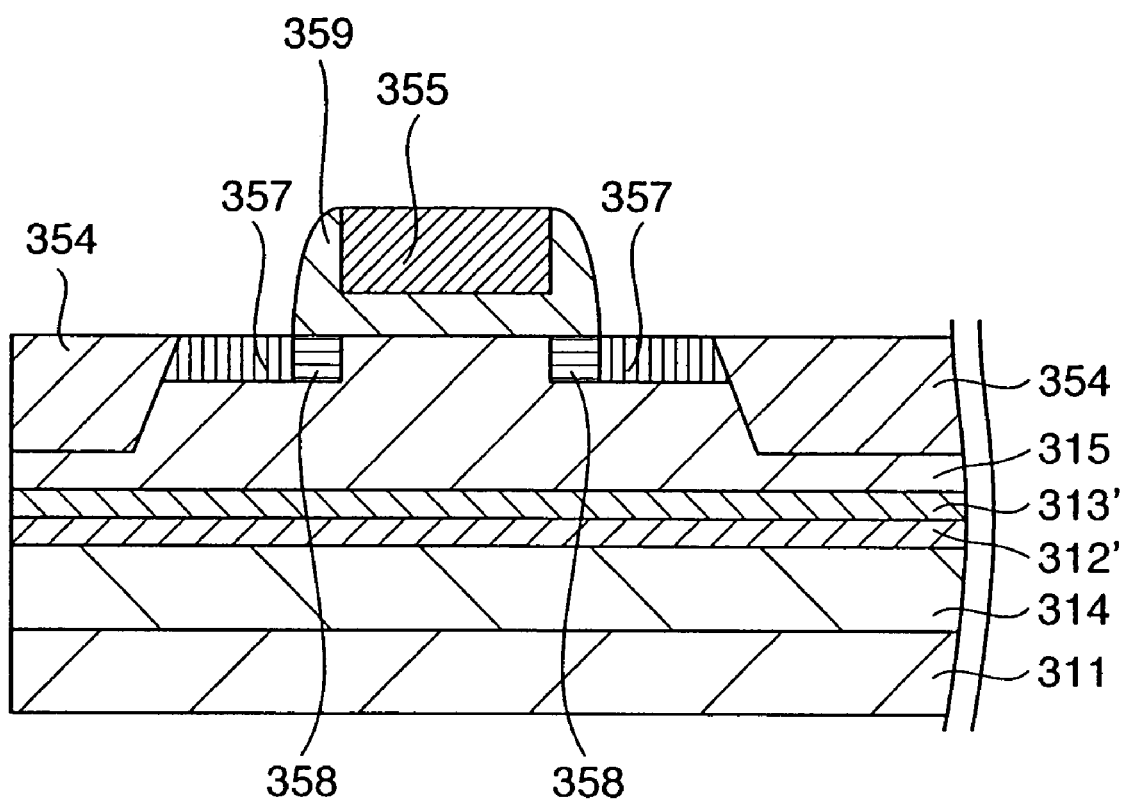
FIG. 33 is a view showing Example 3 of the semiconductor device and the manufacturing method thereof.

An n-type impurity such as phosphorus, arsenic, or antimony or a p-type impurity such as boron is introduced into the semiconductor layer 315 to form relatively lightly doped source and drain regions 358 (FIG. 33). The impurity can be introduced by, e.g., ion implantation and annealing.

An insulating film is formed to cover the gate electrode 355 and etched back to form a sidewall 359 on the side portion of the gate electrode 355.

An impurity of the same conductivity type as the above-described impurity is introduced into the semiconductor layer 315 to form relatively heavily doped source and drain regions 357. With the above-described step, the structure shown in FIG. 33 is obtained.

Figure 34:
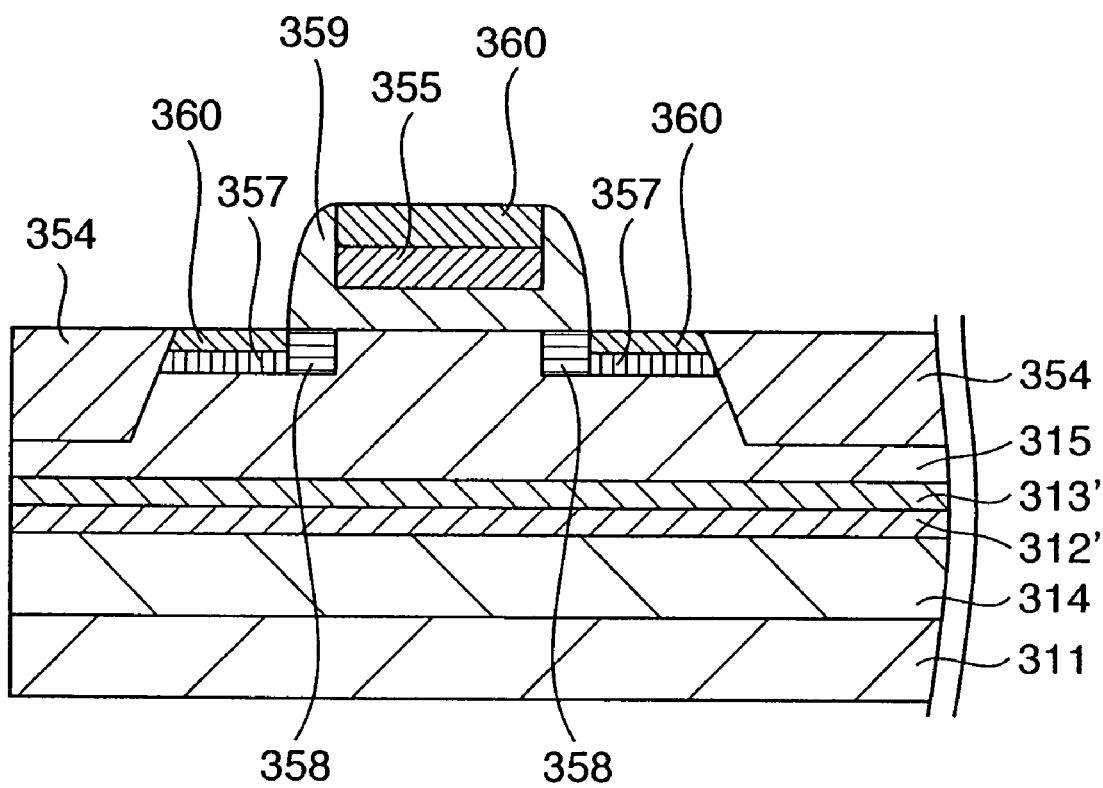
FIG. 34 is a view showing Example 3 of the semiconductor device and the manufacturing method thereof.

A metal silicide layer 360 is formed on the upper surface of the gate electrode 355 and the upper surfaces of the source and drain regions 357 (FIG. 34). As the material of the metal silicide layer 360, e.g., nickel silicide, titanium silicide, cobalt silicide, molybdenum silicide, or tungsten silicide can suitably be used. These silicides can be formed by depositing a metal to cover the upper surface of the gate electrode 355 and the upper surfaces of the source and drain regions 357, executing annealing to cause the metal and underlying silicon to react with each other, and removing an unreacted portion of the metal by an etchant such as sulfuric acid. The surface of the silicide layer may be nitrided as needed. With the above-described step, the structure shown in FIG. 34 is obtained.

Figure 35:
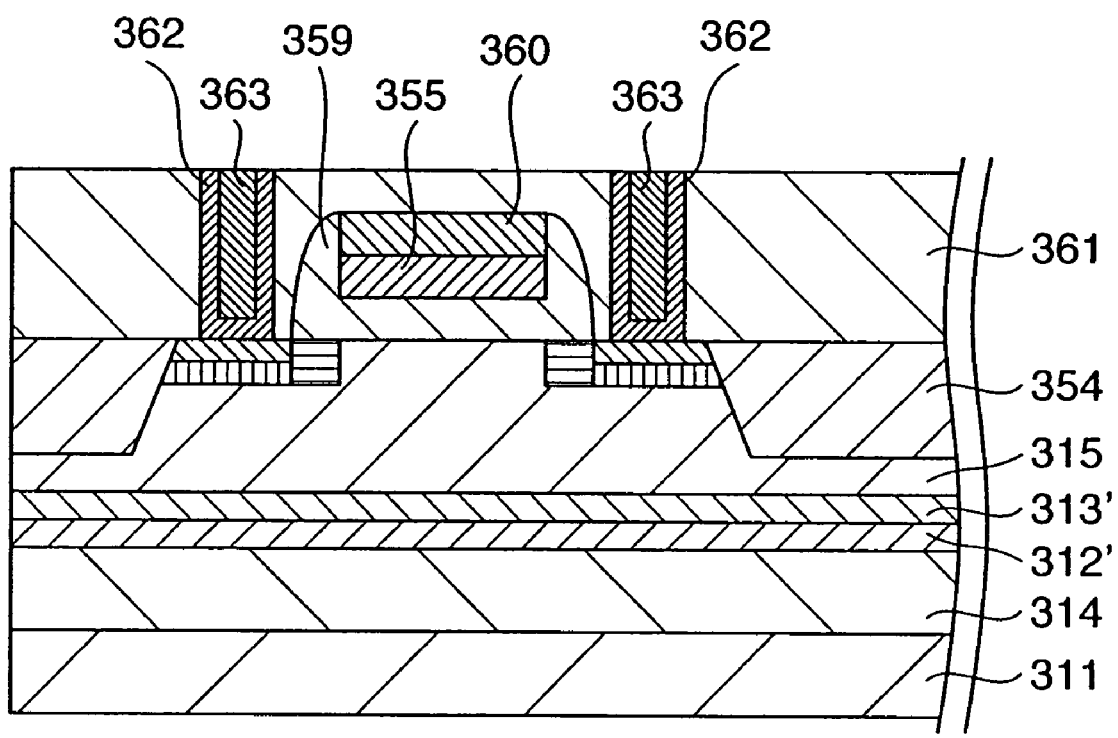
FIG. 35 is a view showing Example 3 of the semiconductor device and the manufacturing method thereof.

An insulating film 361 is formed to cover the upper surface of the gate electrode converted into a silicide and the upper surfaces of the source and drain regions (FIG. 35). As the material of the insulating film 361, silicon oxide containing phosphorus and/or boron can suitably be used.

After the surface is planarized by CMP (Chemical Mechanical Polishing) as needed, contact holes are formed in the insulating film 361. When photolithography using KrF excimer laser, ArF excimer laser, $F_2$ excimer laser, electron beam, or X-rays is used, a rectangular contact hole having a side shorter than 0.25 μm or a circular contact hole having a diameter smaller than 0.25 μm can be formed.

The contact holes are filled with a conductor. As a conductor filling method, suitably, after a film of a refractory metal or a nitride thereof is formed on the inner surface of the contact hole as a barrier metal 362, a conductor 363 such as a tungsten alloy, aluminum, aluminum alloy, copper, or copper alloy is deposited by CVD, PVD (Physical Vapor Deposition), or plating. A conductor deposited higher than the upper surface of the insulating film 361 may be removed by etch back or CMP. Before the contact holes are filled with the conductor, the surface of the silicide in the source and drain regions exposed to the bottom portions of the contact holes may be nitrided. With the above-described step, a transistor such as a FET (Field Effect Transistor) can be formed on the strained-Si layer so that a semiconductor device having a transistor having the structure shown in FIG. 35 is obtained.

As described above, according to this embodiment, the carrier mobility of the semiconductor layer can be increased by using the strained silicon layer. For this reason, a device such as a transistor formed on the semiconductor layer can be driven at a high speed.

The present invention is used for a semiconductor member to form a circuit element such as an insulating gate transistor on a strained semiconductor layer, a manufacturing method thereof, and a semiconductor device in which the circuit element is formed.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2003-434021 filed on Dec. 26, 2003 and Japanese Patent Application No. 2004-265559 filed on Sep. 13, 2004, the entire contents of which are hereby incorporated by reference herein.

The invention claimed is:

1. A semiconductor member comprising:
a first porous semiconductor layer, which is made of SiGe, on a semiconductor substrate;
a second porous semiconductor layer, which is formed on said first porous semiconductor layer;
a semiconductor layer, which is formed on said second porous semiconductor layer; and
a strained Si semiconductor layer, which is formed on said semiconductor layer,
wherein said semiconductor layer is made of a same material as said second porous semiconductor layer.

2. The semiconductor member according to claim 1, wherein said material of said second porous semiconductor layer is one of Si and SiGe.

3. The semiconductor member according to claim 1, wherein said first porous semiconductor layer has lattice relaxation.

* * * * *